US012777969B2

(12) United States Patent
Lee et al.

(10) Patent No.: US 12,777,969 B2
(45) Date of Patent: Oct. 27, 2026

(54) DISPLAY DEVICE AND METHOD OF MANUFACTURING THE SAME

(71) Applicant: Samsung Display Co., LTD., Yongin-si (KR)

(72) Inventors: Jong Chan Lee, Yongin-si (KR); Jin Taek Kim, Yongin-si (KR); Hyun Kim, Yongin-si (KR); Jeong Su Park, Yongin-si (KR); Woong Hee Jeong, Yongin-si (KR); Jung Eun Hong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 807 days.

(21) Appl. No.: 17/960,876

(22) Filed: Oct. 6, 2022

(65) Prior Publication Data

US 2023/0187428 A1 Jun. 15, 2023

(30) Foreign Application Priority Data

Dec. 15, 2021 (KR) ........................ 10-2021-0180104

(51) Int. Cl.
*H10W 90/00* (2026.01)
*H10H 20/01* (2025.01)
(Continued)

(52) U.S. Cl.
CPC .......... *H10W 90/00* (2026.01); *H10H 20/831* (2025.01); *H10H 20/8506* (2025.01); *H10H 20/032* (2025.01); *H10H 20/036* (2025.01)

(58) Field of Classification Search
CPC . H01L 25/167; H01L 25/0753; H10H 20/831; H10H 20/8506; H10H 20/032;
(Continued)

(56) References Cited

U.S. PATENT DOCUMENTS

| | | | |
|---|---|---|---|
| 7,982,812 | B2 | 7/2011 | Rho et al. |
| 12,022,721 | B2 | 6/2024 | Gee et al. |

(Continued)

FOREIGN PATENT DOCUMENTS

| | | |
|---|---|---|
| JP | 2010-160946 | 7/2010 |
| JP | 6557216 | 8/2019 |

(Continued)

OTHER PUBLICATIONS

Korean Notice of Allowance for KR Application No. 10-2021-0180104, dated Sep. 16, 2026, 7 pages.

*Primary Examiner* — Jonathan Han
(74) *Attorney, Agent, or Firm* — Womble Bond Dickinson (US) LLP

(57) ABSTRACT

A display device may include a plurality of pixels each including an emission area and a non-emission area. Each of the plurality of pixels may include a via layer on a substrate and including an organic layer, a first alignment electrode and a second alignment electrode on the via layer in the emission area and spaced apart from each other, a first insulating layer on the first and second alignment electrodes of the emission area and including a lyophilic organic material, a first bank pattern and a second bank pattern on the first insulating layer of the emission area and spaced apart from each other, a first bank in the non-emission area and including a liquid repellent organic material, and a light emitting element on the first insulating layer in the emission area.

20 Claims, 25 Drawing Sheets

(51) Int. Cl.
*H10H 20/831* (2025.01)
*H10H 20/85* (2025.01)

(58) Field of Classification Search
CPC .. H10H 20/036; H10H 20/857; H10H 20/034; H10H 20/84; H10H 29/142; H10H 20/851; H10H 20/852; H10D 86/40; H10W 90/00
See application file for complete search history.

(56) References Cited

U.S. PATENT DOCUMENTS

| | | | | |
|---|---|---|---|---|
| 12,324,312 | B2 | 6/2025 | Kim et al. | |
| 12,374,663 | B2 | 7/2025 | Lee et al. | |
| 2012/0228590 | A1* | 9/2012 | Matsumi | H10K 59/80515 257/40 |
| 2019/0189713 | A1* | 6/2019 | Kondo | H10K 71/135 |
| 2022/0293701 | A1* | 9/2022 | Kim | H10K 59/1213 |
| 2022/0375996 | A1* | 11/2022 | Kim | H10H 20/857 |
| 2023/0006119 | A1* | 1/2023 | Oh | H01L 21/768 |

FOREIGN PATENT DOCUMENTS

| | | | |
|---|---|---|---|
| KR | 10-1376755 | | 3/2014 |
| KR | 10-2020-0027136 | A | 3/2020 |
| KR | 10-2020-0034896 | A | 4/2020 |
| KR | 10-2020-0070493 | A | 6/2020 |
| KR | 10-2020-0134359 | | 12/2020 |
| KR | 10-2021-0023720 | | 3/2021 |
| KR | 10-2021-0085331 | A | 7/2021 |

* cited by examiner

DISPLAY DEVICE AND METHOD OF MANUFACTURING THE SAME

CROSS-REFERENCE TO RELATED APPLICATION(S)

This application claims priority to and benefits of Korean Patent Application No. 10-2021-0180104 under 35 U.S.C. § 119, filed on Dec. 15, 2021 in the Korean Intellectual Property Office (KIPO), the entire contents of which are incorporated herein by reference.

BACKGROUND

1. Technical Field

The disclosure relates to a display device and a method of manufacturing the same.

2. Description of the Related Art

Recently, as interest in information display is increased, research and development of a display device are continuously being conducted.

SUMMARY

One of the objects of the disclosure is for example to provide a display device and a method of manufacturing the same capable of improving reliability.

According to one or more embodiments, a display device may include a substrate, and a plurality of pixels disposed on the substrate and each including an emission area and a non-emission area. Each of the plurality of pixels may include a via layer disposed on the substrate and including an organic layer, a first alignment electrode and a second alignment electrode disposed on the via layer in the emission area and spaced apart from each other, a first insulating layer disposed on the first and second alignment electrodes of the emission area and including a lyophilic organic material, a first bank pattern and a second bank pattern disposed on the first insulating layer of the emission area and spaced apart from each other, a first bank disposed in the non-emission area, including an opening corresponding to the emission area, and including a liquid repellent organic material, and a light emitting element disposed on the first insulating layer between the first bank pattern and the second bank pattern in the emission area.

In one or more embodiments, the first bank pattern and the second bank pattern may include the lyophilic organic material.

In one or more embodiments, the first insulating layer, the first bank pattern, and the second bank pattern may be integral with each other.

In one or more embodiments, the liquid repellent organic material may include an acrylic polymer including a liquid repellent agent and a radical initiator. Here, the liquid repellent agent may be a fluorine-based liquid repellent agent.

In one or more embodiments, the first bank may be disposed on the first insulating layer in the non-emission area.

In one or more embodiments, the via layer, the first insulating layer, the first and second bank patterns, and the first bank may be connected to each other.

In one or more embodiments, the first insulating layer may cover the first alignment electrode, the second alignment electrode, and the via layer in the emission area, and the first insulating layer may not overlap the first bank in a plan view.

In one or more embodiments, wherein the first bank may be disposed on the via layer in the non-emission area.

In one or more embodiments, the first bank pattern may be adjacent to a first end of the light emitting element in the emission area and may contact a side surface of the first bank. The second bank pattern may be adjacent to a second end of the light emitting element in the emission area and may contact another side surface of the first bank.

In one or more embodiments, each of the plurality of pixels may further include a first electrode disposed directly on the first bank pattern and electrically connected to a first end of the light emitting element and the first alignment electrode, and a second electrode disposed directly on the second bank pattern and electrically connected to a second end of the light emitting element and the second alignment electrode.

In one or more embodiments, each of the plurality of pixels may further include a second insulating layer disposed on the light emitting element and exposing the first end and the second end of the light emitting element, and a third insulating layer disposed on the first electrode. The second insulating layer and the third insulating layer may include an inorganic layer.

In one or more embodiments, the first electrode and the second electrode may be disposed on different layers.

In one or more embodiments, the first electrode and the second electrode may be disposed on the same layer.

In one or more embodiments, the first insulating layer may include a first contact hole exposing a portion of the first alignment electrode; and a second contact hole exposing a portion of the second alignment electrode. The first electrode may be electrically connected to the first alignment electrode through the first contact hole, and the second electrode may be electrically connected to the second alignment electrode through the second contact hole.

In one or more embodiments, the first and second contact holes may be disposed in the non-emission area.

In one or more embodiments, each of the plurality of pixels may further include a color conversion layer disposed on the first electrode and the second electrode in the emission area and converting light of a first color emitted from the light emitting element into light of a second color, a second bank disposed on the first bank in the non-emission area and surrounding the color conversion layer, and a color filter disposed on the color conversion layer to selectively transmit the light of the second color.

In one or more embodiments, the second bank and the first bank may include a same material.

In one or more embodiments, each of the plurality of pixels may include at least one transistor disposed between the substrate and the via layer and electrically connected to the light emitting element.

According to the disclosure, a display device may be manufactured by including forming at least one pixel including an emission area and a non-emission area on a substrate. The forming of the at least one pixel may include forming a via layer including an organic layer on the substrate, forming a first alignment electrode and a second alignment electrode spaced apart from each other on the via layer of the emission area, forming a first insulating layer including a lyophilic organic material and having a flat surface on the first and second alignment electrodes of the emission area, forming a first bank pattern overlapping the first alignment electrode in a plan view and a second bank pattern overlapping the second alignment electrode in a plan view, on the first insulating layer of the emission area, forming a first bank including an opening corresponding to the emission area and including a liquid repellent organic material on the first insulating layer of the non-emission area, aligning at least one light emitting element on the first insulating layer between the first bank pattern and the second bank pattern in the emission area, forming a first electrode electrically connected to each of a first end of the at least one light emitting element and the first alignment electrode directly on the first bank pattern, forming a second electrode electrically connected to each of a second end of the at least one light emitting element and the second alignment electrode directly on the second bank pattern. Here, the first bank pattern and the second bank pattern may include the lyophilic organic material.

The display device and the method of manufacturing the same according to one or more embodiments may improve manufacturing process efficiency by forming a bank including a liquid repellent organic material in the non-emission area to omit a liquid repelling process for imparting liquid repellency to the bank.

In addition, the display device and the method of manufacturing the same according to one or more embodiments may dispose the insulating layer and the bank pattern (or a wall structure) each including the lyophilic (or liquid contact) organic material in the emission area. Therefore, a pixel area in which a pixel is disposed may be divided into a hydrophobic area and a hydrophilic area without an additional process to allow the light emitting elements are aligned only in the hydrophilic area, thereby preventing an abnormal alignment defect in which the light emitting elements are aligned in an unwanted area.

In addition, the display device and the method of manufacturing the same according to one or more embodiments may configure insulating layers included in a display element layer only an organic insulating layer (or an organic layer) before the light emitting elements are aligned. Therefore, in case that the organic insulating layer is changed to the inorganic insulating layer (or an inorganic layer) or when the inorganic insulating layer is changed to the organic insulating layer, an additional process for improving inter-layer characteristic variation may be omitted.

An effect according to one or more embodiments is not limited to the contents illustrated above, and some of various effects are described in the specification.

BRIEF DESCRIPTION OF THE DRAWINGS

The above and other features of the disclosure will become more apparent by describing in further detail embodiments thereof with reference to the accompanying drawings, in which:

FIG. 14 is a schematic cross-sectional view taken along line IV-IV' of

FIG. 6;

DETAILED DESCRIPTION OF THE EMBODIMENTS

Figure 1:
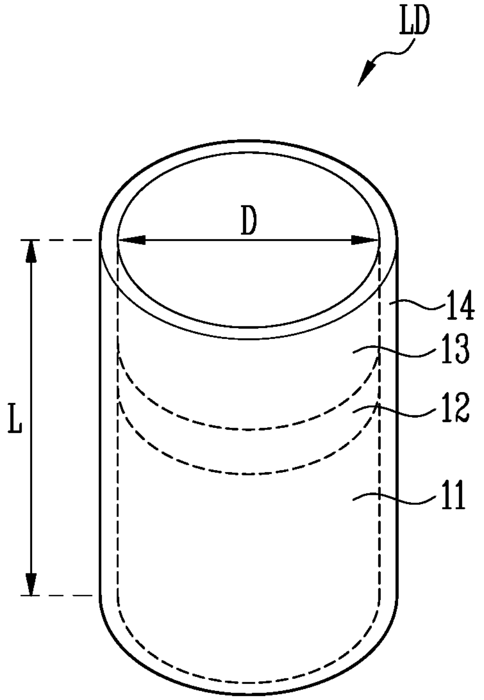
FIG. 1 is a perspective view schematically illustrating a light emitting element according to one or more embodiments.

The disclosure may be modified in various manners and have various forms. Therefore, specific embodiments will be illustrated in the drawings and will be described in detail in the specification. However, it should be understood that the disclosure is not intended to be limited to the disclosed specific forms, and the disclosure includes all modifications, equivalents, and substitutions within the spirit and technical scope of the disclosure.

Similar reference numerals are used for similar components in describing each drawing. In the accompanying drawings, the dimensions of the structures are shown enlarged from the actual dimensions for the sake of clarity of the disclosure. Terms of "first", "second", and the like may be used to describe various components, but the components should not be limited by the terms. The terms are used only for the purpose of distinguishing one component from another component. For example, without departing from the scope of the disclosure, a first component may be referred to as a second component, and similarly, a second component may also be referred to as a first component.

It should be understood that in the application, a term of "include", "have", or the like is used to specify that there is a feature, a number, a step, an operation, a component, a part, or a combination thereof described in the specification, but does not exclude a possibility of the presence or addition of one or more other features, numbers, steps, operations, components, parts, or combinations thereof in advance. In addition, a case where a portion of a layer, a film, an area, a plate, or the like is referred to as being "on" another portion, it includes not only a case where the portion is "directly on" another portion, but also a case where there is further another portion between the portion and another portion. In addition, in the specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion.

In the present application, in a case where "a component (for example, 'a first component') is operatively or communicatively coupled with/to or "connected to" another component (for example, 'a second component'), the case should be understood that the component may be directly connected to the other component, or may be connected to the other component through another component (for example, a 'third component'). In contrast, in a case where a component (for example, ‘a first component’) is “directly coupled with/to or “directly connected” to another component (for example, ‘a second component’), the case may be understood that another component (for example, ‘a third component’) is not present between the component and the other component. It will be understood that the terms “contact,” “connected to,” and “coupled to” may include a physical and/or electrical contact, connection, or coupling.

Hereinafter, embodiments of the disclosure and others necessary for those skilled in the art to understand the disclosure will be described in detail with reference to the accompanying drawings. In the following description, the singular expressions include plural expressions (or meanings) unless the context clearly dictates otherwise.

The phrase “at least one of” is intended to include the meaning of “at least one selected from the group of” for the purpose of its meaning and interpretation. For example, “at least one of A and B” may be understood to mean “A, B, or A and B.”

The terms “about” or “approximately” as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, “about” may mean within one or more standard deviations, or within ±30%, 20%, 10%, 5% of the stated value.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Figure 2:
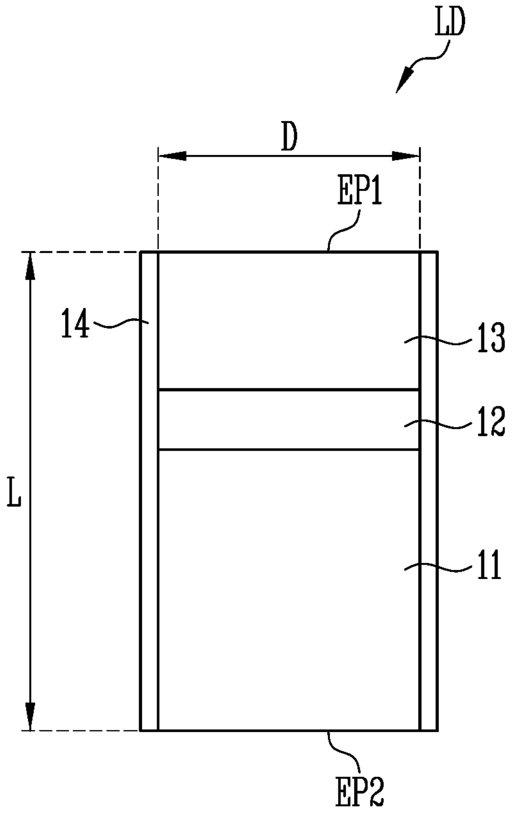
FIG. 2 is a schematic cross-sectional view of the light emitting element of FIG. 1.

FIG. 1 is a perspective view schematically illustrating a light emitting element LD according to one or more embodiments, and FIG. 2 is a schematic cross-sectional view of the light emitting element LD of FIG. 1.

In one or more embodiments, a type and/or a shape of the light emitting element LD are/is not limited to the embodiment shown in FIGS. 1 and 2.

Referring to FIGS. 1 and 2, the light emitting element LD may include a first semiconductor layer 11, a second semiconductor layer 13, and an active layer 12 interposed between the first semiconductor layer 11 and the second semiconductor layer 13. For example, the light emitting element LD may implement a light emitting stack (or a stack pattern) in which the first semiconductor layer 11, the active layer 12, and the second semiconductor layer 13 are sequentially stacked.

The light emitting element LD may be provided in a shape extending in a direction. In case that an extension direction of the light emitting element LD is referred to as a longitudinal direction, the light emitting element LD may include a first end EP1 and a second end EP2 in the longitudinal direction. One of the first semiconductor layer 11 and the second semiconductor layer 13 may be positioned at the first end EP1 of the light emitting element LD, and the other of the first semiconductor layer 11 and the second semiconductor layer 13 may be positioned at the second end EP2 of the light emitting element LD. For example, the second semiconductor layer 13 may be positioned at the first end EP1 of the light emitting element LD, and the first semiconductor layer 11 may be disposed at the second end EP2 of the light emitting element LD.

The light emitting element LD may be provided in various shapes. For example, as shown in FIG. 1, the light emitting element LD may have a rod-like shape, a bar-like shape, or a column shape that is long in the longitudinal direction (or having an aspect ratio greater than about 1) as shown in FIG. 1. As another example, the light emitting element LD may have a rod-like shape, a bar-like shape, or a column shape that is short in the longitudinal direction (or having an aspect ratio of less than about 1). As still another example, the light emitting element LD may have a rod-like shape, a bar-like shape, or a column shape having an aspect ratio of about 1.

The light emitting element LD may include, for example, a light emitting diode (LED) manufactured to be extremely small to have a diameter D and/or a length L of about a nanoscale (or nanometer) to about a microscale (micrometer).

In case that the light emitting element LD is long (or elongated) in a length (L) direction (for example, the aspect ratio is greater than about 1), the diameter D of the light emitting element LD may be about 0.5 μm to about 6 μm, and the length L may be about 1 μm to about 10 μm. However, the diameter D and the length L of the light emitting element LD are not limited thereto. A size of the light emitting element LD may be changed to satisfy a requirement condition (or a design condition) of a lighting device or a light emitting display device to which the light emitting element LD is applied.

For example, the first semiconductor layer 11 may include at least one n-type semiconductor layer. For example, the first semiconductor layer 11 may include at least one semiconductor material among InAlGaN, GaN, AlGaN, InGaN, AlN, and InN, and may be an n-type semiconductor layer doped with a first conductive dopant (or an n-type dopant) such as Si, Ge, or Sn. However, the material forming (or configuring) the first semiconductor layer 11 is not limited thereto, and other various materials may form the first semiconductor layer 11. The first semiconductor layer 11 may include an upper surface contacting the active layer 12 in the length (L) direction of the light emitting element LD and a lower surface exposed to the outside. The lower surface of the first semiconductor layer 11 may be an end portion (or a lower end portion) of the light emitting element LD.

The active layer 12 (or an emission layer) may be disposed on the first semiconductor layer 11 and may be formed in a single quantum well structure or a multiple quantum well structure. For example, in case that the active layer 12 is formed in the multiple quantum well structure, in the active layer 12, a barrier layer, a strain reinforcing layer, and a well layer may be periodically and repeatedly stacked as one unit. The strain reinforcing layer may have a lattice constant less than that of the barrier layer to further strengthen a reinforce strain, for example, a compression strain, applied to the well layer. However, a structure of the active layer 12 is not limited to the above-described embodiment.

The active layer 12 may emit light of a wavelength of about 400 nm to about 900 nm, and may use a double heterostructure. In one or more embodiments, a clad layer doped with a conductive dopant may be formed on and/or under the active layer 12 in the length (L) direction of the light emitting element LD. For example, the clad layer may be formed of (or formed as) an AlGaN layer or an InAlGaN layer. According to one or more embodiments, a material such as AlGaN or InAlGaN may be used to form the active layer 12. In addition, other various materials may form the active layer 12. The active layer 12 may include a first surface contacting the first semiconductor layer 11 and a second surface contacting the second semiconductor layer 13.

In case that an electric field of a voltage (e.g., a predetermined or selected voltage) or more is applied to ends of the light emitting element LD, the light emitting element LD emits light while an electron-hole pair is combined in the active layer 12. By controlling light emission of the light emitting element LD by using such a principle, the light emitting element LD may be used as a light source (or a light emitting source) of various light emitting devices including a pixel of the display device.

The second semiconductor layer 13 may be disposed on the second surface of the active layer 12 and may include a semiconductor layer of a type different from that of the first semiconductor layer 11. For example, the second semiconductor layer 13 may include at least one p-type semiconductor layer. For example, the second semiconductor layer 13 may include at least one semiconductor material among InAlGaN, GaN, AlGaN, InGaN, AlN, and InN, and may include a p-type semiconductor layer doped with a second conductive dopant (or a p-type dopant) such as Mg, Zn, Ca, Sr, or Ba. However, the material forming the second semiconductor layer 13 is not limited thereto, and other various materials may form the second semiconductor layer 13. The second semiconductor layer 13 may include a lower surface contacting the second surface of the active layer 12 in the length (L) direction of the light emitting element LD and an upper surface exposed to the outside. Here, the upper surface of the second semiconductor layer 13 may be another end portion (or an upper end portion) of the light emitting element LD.

In one or more embodiments, the first semiconductor layer 11 and the second semiconductor layer 13 may have thicknesses different from each other in the length (L) direction of the light emitting element LD. For example, the first semiconductor layer 11 may have a thickness relatively thicker than that of the second semiconductor layer 13 in the length (L) direction of the light emitting element LD. Therefore, the active layer 12 of the light emitting element LD may be positioned more adjacently to the upper surface of the second semiconductor layer 13 than to the lower surface of the first semiconductor layer 11.

Although the first semiconductor layer 11 and the second semiconductor layer 13 are shown as being formed as a layer, the disclosure is not limited thereto. In one or more embodiments, according to the material of the active layer 12, each of the first semiconductor layer 11 and the second semiconductor layer 13 may further include at least one or more layers, for example, a clad layer and/or a tensile strain barrier reducing (TSBR) layer. The TSBR layer may be a strain relief layer disposed between semiconductor layers having different lattice structures and serving as a buffer to reduce a difference in lattice constant. The TSBR layer may be formed as a p-type semiconductor layer such as p-GaInP, p-AlInP, and p-AlGaInP, but is not limited thereto.

According to one or more embodiments, the light emitting element LD may further include a contact electrode (hereinafter referred to as a "first contact electrode") disposed on the second semiconductor layer 13 in addition to the above-described first semiconductor layer 11, active layer 12, and second semiconductor layer 13. In addition, according to an embodiment, the light emitting element LD may further include another contact electrode (hereinafter referred to as a "second contact electrode") disposed at an end of the first semiconductor layer 11.

Each of the first and second contact electrodes may be an ohmic contact electrode, but is not limited thereto. According to one or more embodiments, the first and second contact electrodes may be Schottky contact electrodes. The first and second contact electrodes may include a conductive material. For example, the first and second contact electrodes may include an opaque metal using chromium (Cr), titanium (Ti), aluminum (Al), gold (Au), nickel (Ni), an oxide thereof, an alloy thereof, and the like alone or in combination, but are not limited thereto. According to one or more embodiments, the first and second contact electrodes may also include a transparent conductive oxide such as indium tin oxide (ITO), indium zinc oxide (IZO), zinc oxide ($ZnO_x$), indium gallium zinc oxide (IGZO), and indium tin zinc oxide (ITZO). Here, the zinc oxide ($ZnO_x$) may be zinc oxide (ZnO) and/or zinc peroxide ($ZnO_2$).

The materials included in the first and second contact electrodes may be the same as or different from each other. The first and second contact electrodes may be substantially transparent or translucent. Therefore, the light generated by the light emitting element LD may pass through each of the first and second contact electrodes and may be emitted to the outside of the light emitting element LD. According to one or more embodiments, in case that the light generated by the light emitting element LD does not pass through the first and second contact electrodes and is emitted to the outside of the light emitting element LD through an area except for the ends of the light emitting element LD, the first and second contact electrodes may include an opaque metal.

In one or more embodiments, the light emitting element LD may further include an insulating layer 14 (or an insulating film). However, according to one or more embodiments, the insulating layer 14 may be omitted and may be provided so as to cover only a portion of the first semiconductor layer 11, the active layer 12, and the second semiconductor layer 13.

The insulating layer 14 may prevent an electrical short that may occur in case that the active layer 12 contacts a conductive material other than the first and second semiconductor layers 11 and 13. In addition, the insulating layer 14 may minimize a surface defect of the light emitting element LD to improve the lifespan and light emission efficiency of the light emitting element LD. In addition, in case that light emitting elements LD are closely disposed, the insulating layer 14 may prevent an unwanted short that may occur between the light emitting elements LD. In case that the active layer 12 may prevent an occurrence of a short with an external conductive material, presence or absence of the insulating layer 14 is not limited.

The insulating layer 14 may be provided in a form entirely surrounding an outer circumferential surface of the light emitting stack including the first semiconductor layer 11, the active layer 12, and the second semiconductor layer 13.

In the above-described embodiment, the insulating layer 14 entirely surround the outer circumferential surface of each of the first semiconductor layer 11, the active layer 12, and the second semiconductor layer 13, but the disclosure is not limited thereto. According to one or more embodiments, in case that the light emitting element LD includes the first contact electrode, the insulating layer 14 may entirely surround an outer circumferential surface of each of the first semiconductor layer 11, the active layer 12, the second semiconductor layer 13, and the first contact electrode. In addition, according to another embodiment, the insulating layer 14 may not entirely surround the outer circumferential surface of the first contact electrode, or may surround only a portion of the outer circumferential surface of the first contact electrode and may not surround the remaining of the outer circumferential surface of the first contact electrode. In addition, according to one or more embodiments, in case that the first contact electrode is disposed at another end (or the upper end) of the light emitting element LD and the second contact electrode is disposed at the end (or the lower end) of the light emitting element LD, the insulating layer 14 may expose at least one area of each of the first and second contact electrodes.

The insulating layer 14 may include a transparent insulating material. For example, the insulating layer 14 may include at least one insulating material selected from the group consisting of silicon oxide ($SiO_x$), silicon nitride ($SiN_x$), silicon oxynitride ($SiO_xN_y$), aluminum oxide ($AlO_x$), titanium oxide ($TiO_x$), hafnium oxide ($HfO_x$), titanium strontium oxide ($SrTiO_x$), cobalt oxide ($Co_xO_y$), magnesium oxide (MgO), zinc oxide ($ZnO_x$), rucenium oxide ($RuO_x$), nickel oxide (NiO), tungsten oxide ($WO_x$), tantalum oxide ($TaO_x$), gadolinium oxide ($GdO_x$), zirconium oxide ($ZrO_x$), gallium oxide ($GaO_x$), vanadium oxide ($V_xO_y$), ZnO:Al, ZnO:B, $In_xO_y$:H, niobium oxide ($Nb_xO_y$), magnesium fluoride ($MgF_x$), aluminum fluoride ($AlF_x$), Alucone polymer film, titanium nitride (TiN), tantalum nitride (TaN), aluminum nitride ($AlN_x$), gallium nitride (GaN), tungsten nitride (WN), hafnium nitride (HfN), niobium nitride (NbN), gadolinium nitride (GdN), zirconium nitride (ZrN), and vanadium nitride (VN), but the disclosure is not limited thereto, and various materials having insulating properties may be used as the material of the insulating layer 14.

The insulating layer 14 may be provided in a form of a single layer, or may be provided in a form of multiple layers including double layers. For example, in case that the insulating layer 14 is formed as the double layers including a first insulating layer and a second insulating layer sequentially stacked, the first insulating layer and the second insulating layer may be formed of different materials (or substances), and may be formed by different processes. According to one or more embodiments, the first insulating layer and the second insulating layer may be formed by a continuous process including a same material.

According to one or more embodiments, the light emitting element LD may be implemented with a light emitting pattern having a core-shell structure. In this case, the above-described first semiconductor layer 11 may be positioned in a core, for example, a middle (or a center) of the light emitting element LD, the active layer 12 may be provided and/or formed in a form surrounding the outer circumferential surface of the first semiconductor layer 11, and the second semiconductor layer 13 may be provided and/or formed in a form surrounding the outer circumferential surface of the active layer 12. In addition, the light emitting element LD may further include a contact electrode (not shown) surrounding at least one side of the second semiconductor layer 13. In addition, according to one or more embodiments, the light emitting element LD may further include the insulating layer 14 provided on an outer circumferential surface of the light emitting pattern having the core-shell structure and including a transparent insulating material. The light emitting element LD implemented with the light emitting pattern having the core-shell structure may be manufactured by a growth method.

The above-described light emitting element LD may be used as a light emitting source (or a light source) of various display devices. The light emitting element LD may be manufactured by a surface treatment process. For example, in case that light emitting elements LD are mixed in a fluid solution (or solvent) and supplied to each pixel area (for example, an emission area of each pixel or an emission area of each sub-pixel), surface treatment may be performed on each of the light emitting elements LD so that the light emitting elements LD may be uniformly sprayed without being unevenly aggregated in the solution.

A light emitting part (or a light emitting device) including the light emitting element LD described above may be used in various types of electronic devices that require a light source, including a display device. For example, in case that light emitting elements LD are disposed in a pixel area of each pixel of a display panel, the light emitting elements LD may be used as a light source of each pixel. However, an application field of the light emitting element LD is not limited to the above-described example. For example, the light emitting element LD may be used in other types of electronic devices that require a light source, such as a lighting device.

Figure 3:
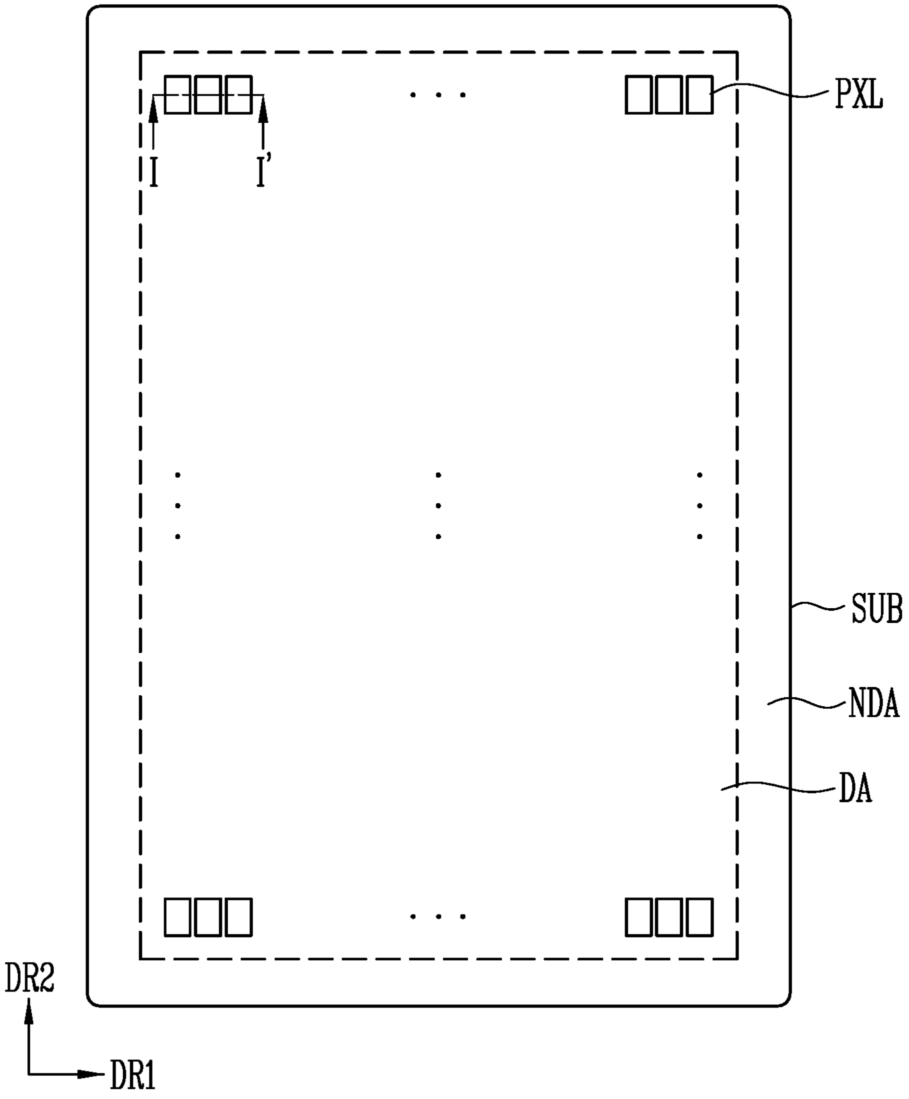
FIG. 3 is a schematic plan view schematically illustrating a display device according to one or more embodiments.

FIG. 3 is a plan view schematically illustrating a display device according to one or more embodiments.

For convenience, FIG. 3 illustrates a structure of the display device, focusing on a display area DA where an image is displayed.

In case that the display device is an electronic device to which a display surface is applied to at least one surface, such as a smartphone, a television, a tablet personal computer (PC), a mobile phone, a video phone, an electronic-book reader, a desktop PC, a laptop PC, a netbook computer, a workstation, a server, a personal digital assistant (PDA), a portable multimedia player (PMP), an MP3 player, a medical device, a camera, or wearable device, the disclosure may be applied to the display device.

Referring to FIGS. 1 to 3, the display device may include a substrate SUB, pixels PXL disposed in the substrate SUB and respectively including at least one light emitting element LD, a driver driving the pixels PXL, and a line part connecting the pixels PXL and the driver.

The display device may be classified into a passive matrix type display device and an active matrix type display device according to a method of driving the light emitting element LD. For example, in case that the display device is implemented as an active matrix type display device, each of the pixels PXL may include a driving transistor that controls a current amount supplied to the light emitting element LD, a switching transistor that transfers a data signal to the driving transistor, and the like.

The display device may be provided in various shapes, and for example, may be provided in a rectangular plate shape having two pairs of sides parallel to each other, but the disclosure is not limited thereto. In case that the display device is provided in the rectangular plate shape, one pair of sides of the two pairs of sides may be provided to be longer than the other pair of sides. For convenience, FIG. 3 illustrates a case where the display device has a rectangular shape having a pair of long sides and a pair of short sides. In addition, an extension direction of the long side is denoted as a first direction DR2, and an extension direction of the short side is denoted as a second direction DR1. In the display device provided in the rectangular plate shape, a corner portion in which a long side and a short side contact (or meet) each other may have a round shape, but is not limited thereto.

The substrate SUB may include the display area DA and a non-display area NDA.

The display area DA may be an area where the pixels PXL displaying an image are provided. The non-display area NDA may be an area in which the driver for driving the pixels PXL and a portion of the line part connecting the pixels PXL and the driver are provided.

The non-display area NDA may be positioned adjacent to the display area DA. The non-display area NDA may be provided on at least one side of the display area DA. For example, the non-display area NDA may surround a circumference (or an edge) of the display area DA. The line part electrically connected to the pixels PXL and the driver electrically connected to the line part and driving the pixels PXL may be provided in the non-display area NDA.

The line part may electrically connect the driver and the pixels PXL. The line part may include a fan-out line electrically connected to signal lines providing a signal to the pixel PXL and electrically connected to each pixel PXL, for example, a scan line, a data line, an emission control line, or the like. In addition, according to one or more embodiments, the line part may include a fan-out line electrically connected to signal lines electrically connected to each pixel PXL to compensate for an electrical characteristic change of each pixel PXL in real time, for example, a control line, a sensing line, or the like. Additionally, the line part may include a fan-out line electrically connected to power lines providing a voltage to each pixel PXL and electrically connected to each pixel PXL.

The substrate SUB may include a transparent insulating material and may transmit light. The substrate SUB may be a rigid substrate or a flexible substrate.

An area on the substrate SUB may be provided as the display area DA and thus the pixels PXL may be disposed. The remaining area on the substrate SUB may be provided as the non-display area NDA. For example, the substrate SUB may include the display area DA including pixel areas in which each pixel PXL is disposed, and the non-display area NDA disposed around the display area DA (or adjacent to the display area DA).

Each of the pixels PXL may be provided in the display area DA on the substrate SUB. In one or more embodiments, the pixels PXL may be arranged in the display area DA in a stripe arrangement structure or the like, but the disclosure is not limited thereto.

Each of the pixels PXL may include at least one light emitting element LD driven by corresponding scan signal and data signal. The light emitting element LD may have a size as small as a nanoscale (or nanometer) to a microscale (or micrometer) and may be electrically connected in parallel with adjacent light emitting elements, but the disclosure is not limited thereto. The light emitting element LD may form a light source of each of the pixels PXL.

Each of the pixels PXL may include at least one light source driven by a signal (for example, a scan signal, a data signal, and the like) and/or power (for example, first driving power, second driving power, and the like), for example, the light emitting element LD shown in FIGS. 1 and 2. However, in one or more embodiments, the type of the light emitting element LD that may be used as the light source of each of the pixels PXL is not limited thereto.

The driver may supply a signal and power to each pixel PXL through the line part, and thus may control driving of the pixel PXL.

Figure 4:
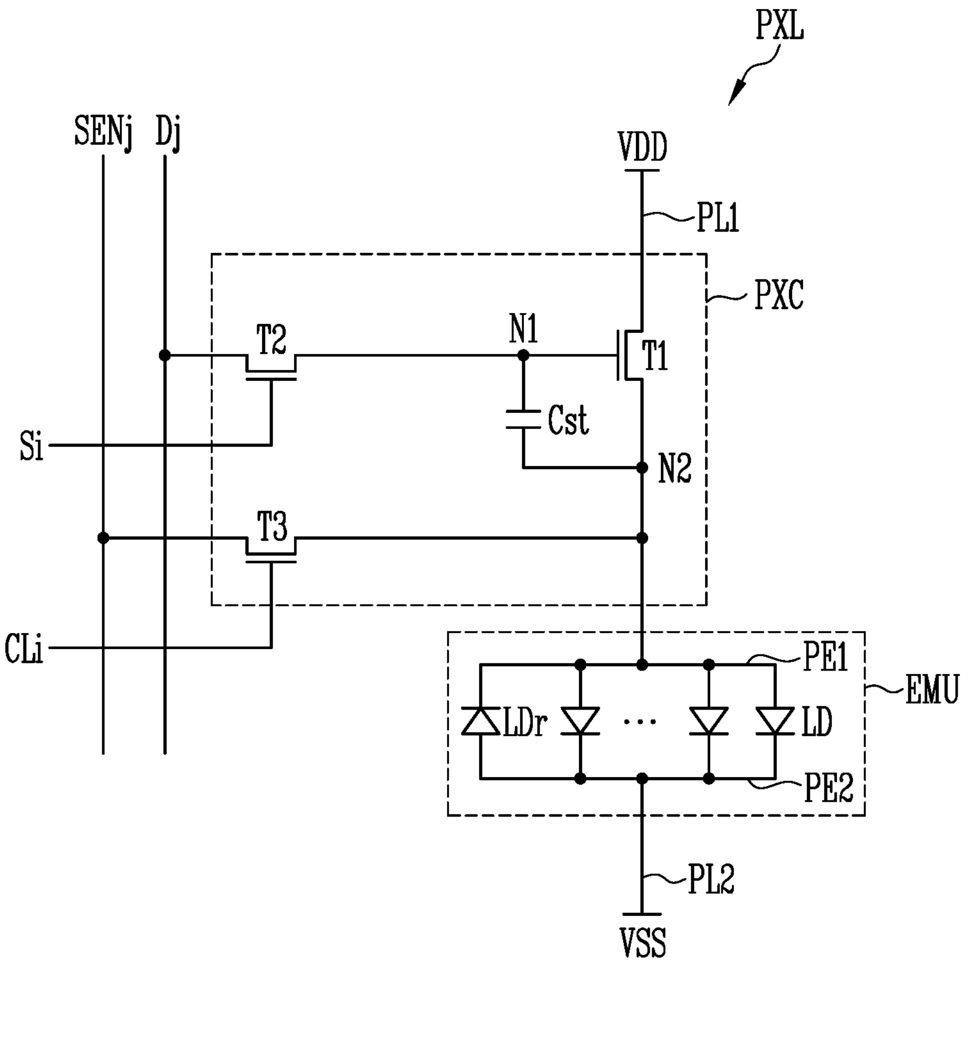
FIGS. 4 and 5 schematic diagrams of equivalent circuits illustrating an electrical connection relationship between components included in each pixel shown in FIG. 3.
Figure 5:
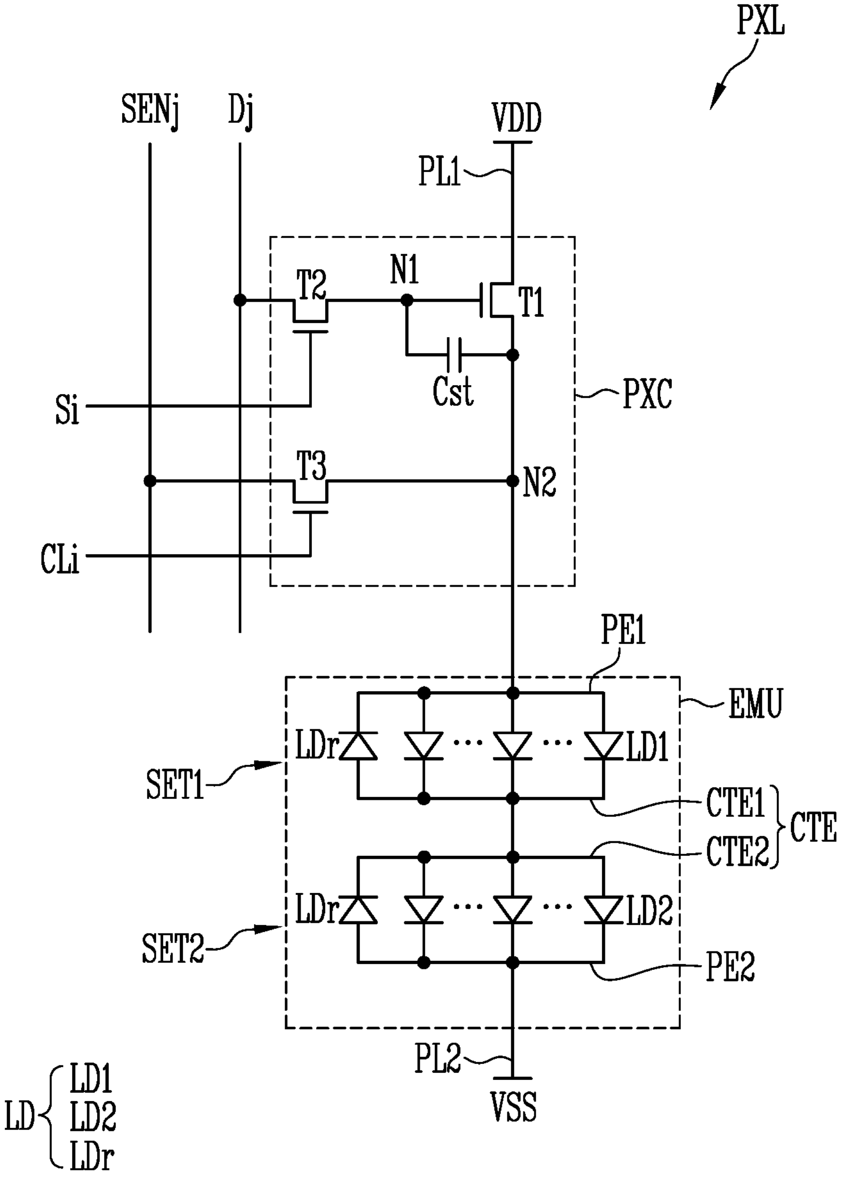

FIGS. 4 and 5 schematic diagrams of equivalent circuits illustrating an electrical connection relationship between components included in each pixel PXL shown in FIG. 3.

For example, FIGS. 4 and 5 illustrate the electrical connection relationship between the components included in the pixel PXL that may be applied to an active matrix type display device according to various embodiments. However, types of the components included in the pixel PXL that may be applied to the embodiment are not limited thereto.

Referring to FIGS. 1 to 5, the pixel PXL may include a light emitting unit (or light emitting part) EMU (or an emission part) that generates light of a luminance corresponding to a data signal. In addition, the pixel PXL may selectively further include a pixel circuit PXC for driving the light emitting unit EMU.

According to one or more embodiments, the light emitting unit EMU may include light emitting elements LD electrically connected in parallel between a first power line PL1 electrically connected to first driving power VDD to which a voltage of the first driving power VDD is applied and a second power line PL2 electrically connected to second driving power VSS to which a voltage of second driving power VSS is applied. For example, the light emitting unit EMU may include a first pixel electrode PE1 electrically connected to the first driving power VDD through the pixel circuit PXC and the first power line PL1, a second pixel electrode PE2 electrically connected to the second driving power VSS through the second power line PL2, and the light emitting elements LD electrically connected in parallel in a same direction between the first and second pixel electrodes PE1 and PE2. In one or more embodiments, the first pixel electrode PE1 may be an anode, and the second pixel electrode PE2 may be a cathode.

Each of the light emitting elements LD included in the light emitting unit EMU may include an end electrically connected to the first driving power VDD through the first pixel electrode PE1 and another end electrically connected to the second driving power VSS through the second pixel electrode PE2. The first driving power VDD and the second driving power VSS may have different potentials. For example, the first driving power VDD may be set as high potential power, and the second driving power VSS may be set as low potential power. In this case, a potential difference between the first driving power VDD and the second driving power VSS may be set as a threshold voltage or more of the light emitting elements LD during an emission period of the pixel PXL.

As described above, the respective light emitting elements LD electrically connected in parallel in the same direction (for example, a forward direction) between the first pixel electrode PE1 and the second pixel electrode PE2 to which the voltages of the different power are supplied may form respective effective light sources.

The light emitting elements LD of the light emitting unit EMU may emit light with a luminance corresponding to a driving current supplied through a corresponding pixel circuit PXC. For example, a driving current corresponding to a grayscale value of corresponding frame data of the pixel circuit PXC may be supplied to the light emitting unit EMU during each frame period. The driving current supplied to the light emitting unit EMU may be divided and flow to each of the light emitting elements LD. Therefore, each of the light emitting elements LD may emit light with a luminance corresponding to the current flowing through the light emitting element LD, and thus the light emitting unit EMU may emit light of the luminance corresponding to the driving current.

One or more embodiments in which ends of the light emitting elements LD are electrically connected in the same direction between the first and second driving power VDD and VSS is described, but the disclosure is not limited thereto. According to one or more embodiments, the light emitting unit EMU may further include at least one ineffective light source, for example, a reverse light emitting element LDr, in addition to the light emitting elements LD forming each effective light source. The reverse light emitting element LDr may be electrically connected in parallel between the first and second pixel electrodes PE1 and PE2 together with the light emitting elements LD forming the effective light sources, and may be electrically connected between the first and second pixel electrodes PE1 and PE2 in a direction opposite to the light emitting elements LD. The reverse light emitting element LDr maintains an inactive state even though a driving voltage (e.g., a predetermined or selected driving voltage) (for example, a driving voltage of a forward direction) is applied between the first and second pixel electrodes PE1 and PE2, and thus a current substantially does not flow through the reverse light emitting element LDr.

The pixel circuit PXC may be electrically connected to a scan line Si and a data line Dj of the pixel PXL. In addition, the pixel circuit PXC may be electrically connected to a control line CLi and a sensing line SENj of the pixel PXL. For example, in case that the pixel PXL is disposed in an i-th row and a j-th column of the display area DA, the pixel circuit PXC of the pixel PXL may be electrically connected to the i-th scan line Si, the j-th data line Dj, the i-th control line CLi, and the j-th sensing line SENj of the display area DA.

The pixel circuit PXC may include first to third transistors T1 to T3 and a storage capacitor Cst.

The first transistor T1 may be a driving transistor for controlling the driving current applied to the light emitting unit EMU, and may be electrically connected between the first driving power VDD and the light emitting unit EMU. Specifically, a first terminal of the first transistor T1 may be electrically connected (or coupled) to the first driving power VDD through the first power line PL1, a second terminal of the first transistor T1 may be electrically connected to a second node N2, and a gate electrode of the first transistor T1 may be electrically connected to a first node N1. The first transistor T1 may control an amount of the driving current applied from the first driving power VDD to the light emitting unit EMU through the second node N2, according to a voltage applied to the first node N1. In one or more embodiments, the first terminal of the first transistor T1 may be a drain electrode, and the second terminal of the first transistor T1 may be a source electrode, but the disclosure is not limited thereto. According to one or more embodiments, the first terminal may be a source electrode and the second terminal may be a drain electrode.

The second transistor T2 may be a switching transistor that selects the pixel PXL in response to a scan signal and activates the pixel PXL, and may be electrically connected between the data line Dj and the first node N1. A first terminal of the second transistor T2 may be electrically connected to the data line Dj, a second terminal of the second transistor T2 may be electrically connected to the first node N1, and a gate electrode of the second transistor T2 may be electrically connected to the scan line Si. The first terminal and the second terminal of the second transistor T2 may be different terminals. For example, in case that the first terminal is a drain electrode, the second terminal may be a source electrode.

The second transistor T2 may be turned on in case that a scan signal of a gate-on voltage (for example, a high level voltage) is supplied from the scan line Si, to electrically connect the data line Dj and the first node N1. The first node N1 may be a point where the second terminal of the second transistor T2 and the gate electrode of the first transistor T1 are electrically connected, and the second transistor T2 may transmit a data signal to the gate electrode of the first transistor T1.

The third transistor T3 may connect the first transistor T1 to the sensing line SENj to obtain a sensing signal through the sensing line SENj, and detect a characteristic of each pixel PXL including a threshold voltage and the like of the first transistor T1 by using the sensing signal. Information on the characteristic of each pixel PXL may be used to convert image data so that a characteristic deviation between the pixels PXL may be compensated. A second terminal of the third transistor T3 may be electrically connected to the second terminal of the first transistor T1, a first terminal of the third transistor T3 may be electrically connected to the sensing line SENj, and a gate electrode of the third transistor T3 may be electrically connected to the control line CLi. In addition, the first terminal of the third transistor T3 may be electrically connected to initialization power. The third transistor T3 may be an initialization transistor capable of initializing the second node N2, and may be turned on in case that a sensing control signal is supplied from the control line CLi, to transmit a voltage of the initialization power to the second node N2. Accordingly, a second storage electrode of the storage capacitor Cst electrically connected to the second node N2 may be initialized.

A first storage electrode of the storage capacitor Cst may be electrically connected to the first node N1, and a second storage electrode of the storage capacitor Cst may be electrically connected to the second node N2. The storage capacitor Cst charges a data voltage corresponding to the data signal supplied to the first node N1 during a frame period. Accordingly, the storage capacitor Cst may store a voltage corresponding to a voltage difference between a voltage of the gate electrode of the first transistor T1 and a voltage of the second node N2.

Although FIG. 4 illustrates one or more embodiments in which all of the light emitting elements LD forming the light emitting unit EMU are electrically connected in parallel, the disclosure is not limited thereto. According to one or more embodiments, the light emitting unit EMU may be configured to include at least one series stage including the light emitting elements LD electrically connected in parallel with each other. For example, the light emitting unit EMU may be configured in a series-parallel mixed structure as shown in FIG. 5.

Referring to FIG. 5, the light emitting unit EMU may include first and second series stages SET1 and SET2 sequentially electrically connected between the first and second driving power VDD and VSS. Each of the first and second series stages SET1 and SET2 may include two electrodes PE1 and CTE1, and CTE2 and PE2 forming an electrode pair of a corresponding series stage, and the light emitting elements LD electrically connected in parallel in the same direction between the two electrodes PE1 and CTE1, and CTE2 and PE2.

The first series stage SET1 may include the first pixel electrode PE1, a first intermediate electrode CTE1, and at least one first light emitting element LD1 electrically connected between the first pixel electrode PE1 and the first intermediate electrode CTE1. In addition, the first series stage SET1 may include the reverse light emitting element LDr electrically connected in a direction opposite to the first light emitting element LD1 between the first pixel electrode PE1 and the first intermediate electrode CTE1.

The second series stage SET2 may include a second intermediate electrode CTE2, the second pixel electrode PE2, and at least one second light emitting element LD2 electrically connected between the second intermediate electrode CTE2 and the second pixel electrode PE2. In addition, the second series stage SET2 may include the reverse light emitting element LDr electrically connected in a direction opposite to the second light emitting element LD2 between the second intermediate electrode CTE2 and the second pixel electrode PE2.

The first intermediate electrode CTE1 and the second intermediate electrode CTE2 may be electrically/physically connected to each other. The first intermediate electrode CTE1 and the second intermediate electrode CTE2 may form an intermediate electrode CTE that electrically connects the continuous first series stage SET1 and second series stage SET2.

In the above-described embodiment, the first pixel electrode PE1 of the first series stage SET1 may be the anode of each pixel PXL, and the second pixel electrode PE2 of the second series stage SET2 may be the cathode of the corresponding pixel PXL.

As described above, the light emitting unit EMU of the pixel PXL including the first and second series stages SET1 and SET2 (or the light emitting elements LD) electrically connected in a series-parallel mixed structure may readily adjust a driving current/voltage condition according to an applied product specification.

In particular, the light emitting unit EMU of the pixel PXL including the first and second series stages SET1 and SET2 (or the light emitting elements LD) electrically connected in the series-parallel mixed structure may reduce a driving current compared to the light emitting part having a structure in which the light emitting elements LD are electrically connected only in parallel. In addition, the light emitting unit EMU of the pixel PXL including the first and second series stages SET1 and SET2 electrically connected in the series-parallel mixed structure may reduce a driving voltage applied to ends of the light emitting unit EMU compared to the light emitting part in which all of a same number of light emitting elements LD are electrically connected in series. Furthermore, the light emitting unit EMU of the pixel PXL including the first and second series stages SET1 and SET2 (or the light emitting elements LD electrically connected in the series-parallel mixed structure may include a greater number of light emitting elements LD between a same number of electrodes PE1, CTE1, CTE2, and PE2 compared to the light emitting part having a structure in which all of the series stages are electrically connected in series. In this case, light emission efficiency of the light emitting elements LD may be improved, and even though a defect occurs in a specific series stage, a ratio of the light emitting elements LD that do not emit light due to the defect may be relatively reduced, and thus a reduction of light emission efficiency of the light emitting elements LD may be alleviated.

FIGS. 4 and 5 illustrate one or more embodiments in which all of the first, second, and third transistors T1, T2, and T3 included in the pixel circuit PXC are N-type transistors, but the disclosure is not limited thereto. For example, at least one of the above-described first, second, and third transistors T1, T2, and T3 may be changed to a P-type transistor. In addition, FIGS. 4 and 5 illustrate one or more embodiments in which the light emitting unit EMU is electrically connected between the pixel circuit PXC and the second driving power VSS, but the light emitting unit EMU may be electrically connected between the first driving power VDD and the pixel circuit PXC.

A structure of the pixel circuit PXC may be variously changed. For example, the pixel circuit PXC may further include at least one transistor element such as a transistor element for initializing the first node N1, and/or a transistor element for controlling an emission time of the light emitting elements LD, and other circuit elements such as a boosting capacitor for boosting the voltage of the first node N1.

A structure of the pixel PXL that may be applied to one or more embodiments is not limited to the embodiments shown in FIGS. 4 and 5, and the corresponding pixel PXL may have various structures. For example, each pixel PXL may be formed inside a passive light emitting display device or the like. In this case, the pixel circuit PXC may be omitted, and the ends of the light emitting elements LD included in the light emitting unit EMU may be directly electrically connected to the scan line Si, the data line Dj, the first power line PL1 to which the first driving power VDD is applied, the second power line PL2 to which the second driving power VSS is applied, a control line, and/or the like.

Figure 6:
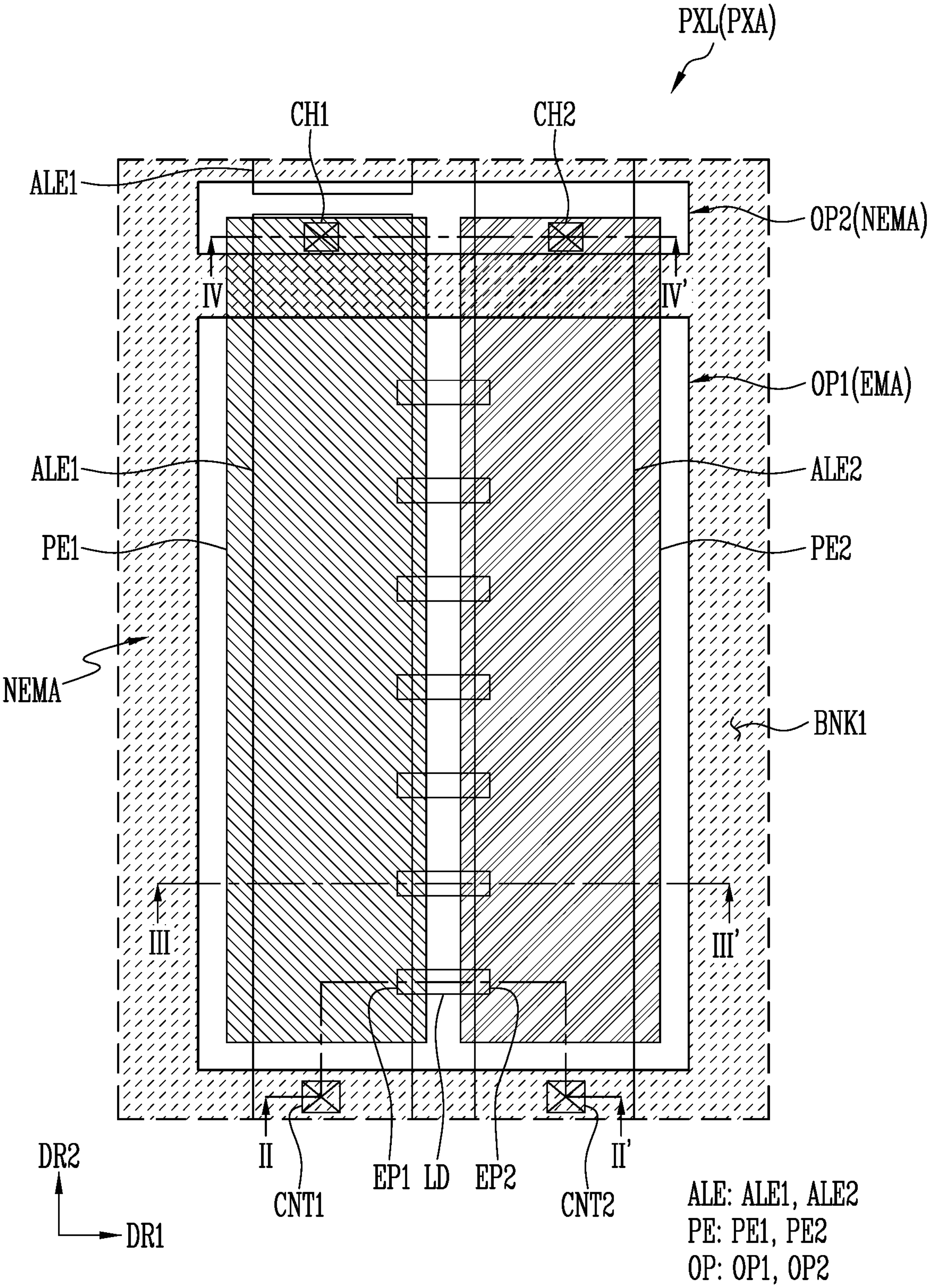
FIG. 6 is a plan view schematically illustrating the pixel shown in FIG. 3.

FIG. 6 is a plan view schematically illustrating the pixel PXL shown in FIG. 3.

In FIG. 6, illustration of transistors electrically connected to the light emitting elements LD and signal lines electrically connected to the transistors is omitted for convenience.

In FIG. 6, for convenience of description, a horizontal direction in a plan view is denoted as the first direction DR1, and a vertical direction in a plan view is denoted as the second direction DR2.

In the following embodiment, not only components included in the pixel PXL shown in FIG. 6 but also an area in which the components are provided (or positioned) are referred to as the pixel PXL.

Referring to FIGS. 1 to 6, the pixel PXL may be positioned in a pixel area PXA arranged (or provided) on the substrate SUB. The pixel area PXA may include an emission area EMA and a non-emission area NEMA.

The pixel PXL may include a first bank BNK1 positioned in the non-emission area NEMA and the light emitting elements LD positioned in the emission area EMA.

The first bank BNK1 may be a structure defining (or partitioning) the pixel area PXA (or the emission area EMA) of each of the pixel PXL and adjacent pixels PXL adjacent thereto, and may be, for example, a pixel defining layer.

In one or more embodiments, the first bank BNK1 may be a pixel defining layer or a dam structure that defines each emission area EMA where the light emitting elements LD are to be supplied in a process of supplying (or inputting) the light emitting elements LD to the pixel PXL. For example, a liquid mixture (for example, an ink) including the light emitting element LD of a targeted amount and/or type may be supplied (or input) to the emission area EMA by dividing the emission area EMA of the pixel PXL by the first bank BNK1. According to one or more embodiments, in a process of supplying a color conversion layer (not shown) to the pixel PXL, the first bank BNK1 may be a pixel defining layer that finally defines each emission area EMA to which the color conversion layer is required to be supplied.

According to one or more embodiments, the first bank BNK1 may be configured to include at least one light blocking material and/or reflective material (or a scattering material) to prevent a light leakage defect in which light leaks between the pixel PXL and the pixels PXL adjacent thereto. According to one or more embodiments, the first bank BNK1 may include a transparent material (or substance). The transparent material may include, for example, polyamides resin, polyimides resin, or the like, but the disclosure is not limited thereto. According to an embodiment, a reflective material layer may be separately provided and/or formed on the first bank BNK1 in order to further improve efficiency of light emitted from the pixel PXL.

The first bank BNK1 may include an organic layer (or an organic insulating layer). The first bank BNK1 may be utilized as a discharge portion that is electrically connected to (in contact with, or contacts) other insulating layers included in the pixel PXL and formed of an organic layer to discharge (emit) an adjacent outgas generated from the insulating layers.

In one or more embodiments, the first bank BNK1 may be an organic layer including a liquid repellent organic material. For example, the first bank BNK1 may include an acrylic polymer including a liquid repellent agent and a radical initiator, but is not limited thereto. The liquid repellent agent may include a fluorine-based liquid repellent agent, but is not limited thereto. The fluorine-based liquid repellent agent may be an addition polymer including a structural unit derived from a fluorinated compound having a fluoroalkyl group of about 4 to about 6 carbon atoms, but is not limited thereto.

The first bank BNK1 may include at least one opening OP exposing configurations positioned thereunder. For example, the first bank BNK1 may include a first opening OP1 and a second opening OP2 exposing the configurations positioned under the first bank BNK1 in the pixel area PXA. In one or more embodiments, the emission area EMA of the pixel PXL and the first opening OP1 of the first bank BNK1 may correspond to each other.

In the pixel area PXA, the second opening OP2 may be positioned to be spaced apart from the first opening OP1 and may be positioned adjacent to a side, for example, an upper side, of the pixel area PXA. In one or more embodiments, the second opening OP2 may be an electrode separation area in which at least one alignment electrode ALE is separated from at least one alignment electrode ALE provided to the pixels PXL adjacent in the second direction DR2.

The pixel PXL may include pixel electrodes PE provided at least in the emission area EMA, the light emitting elements LD electrically connected to the pixel electrodes PE, and alignment electrodes ALE provided at a position corresponding to the pixel electrodes PE. For example, the pixel PXL may include the first and second pixel electrodes PE1 and PE2 provided at least in the emission area EMA, the light emitting elements LD, and first and second alignments electrodes ALE1 and ALE2.

The number, shape, size, arrangement structure, and the like of each of the pixel electrodes PE and the alignment electrodes ALE may be variously changed according to a structure of the pixel PXL (in particular, the light emitting unit EMU).

In one or more embodiments, the alignment electrodes ALE, the light emitting elements LD, and the pixel electrodes PE may be sequentially provided on a surface of the substrate SUB on which the pixel PXL is provided, but the disclosure is not limited thereto. In some embodiments, the position and formation order of electrode patterns forming the pixel PXL (or the light emitting unit EMU) may be variously changed. The stack of the pixel PXL will be described with reference to FIGS. 7 to 14.

The alignment electrodes ALE may include a first alignment electrode ALE1 and a second alignment electrode ALE2 arranged to be spaced apart from each other in the first direction DR1.

At least one of the first and second alignment electrodes ALE1 and ALE2 may be separated from another electrode (for example, the alignment electrode ALE provided to each of the adjacent pixels PXL adjacent in the second direction DR2) in the second opening OP2 (or an electrode separation area) after the light emitting elements LD are supplied and aligned to the pixel area PXA in a manufacturing process of the display device. For example, an end of the first alignment electrode ALE1 may be separated from the first alignment electrode ALE1 positioned above the corresponding pixel PXL in the second direction DR2 within the second opening OP2.

The first alignment electrode ALE1 may be electrically connected to the first transistor T1 described with reference to FIGS. 4 and 5 through a first contact portion CNT1, and the second alignment electrode ALE2 may be electrically connected to the second power line PL2 (or the second driving power VSS) described with reference to FIGS. 4 and 5 through a second contact portion CNT2.

The first contact portion CNT1 may be formed by removing a portion of at least one insulating layer positioned between the first alignment electrode ALE1 and the first transistor T1, and the second contact portion CNT2 may be formed by removing a portion of at least one insulating layer positioned between the second alignment electrode ALE2 and the second power line PL2. In one or more embodiments, the first contact portion CNT1 and the second contact portion CNT2 may be positioned in the non-emission area NEMA to overlap the first bank BNK1. However, the disclosure is not limited thereto, and according to one or more embodiments, the first and second contact portions CNT1 and CNT2 may be positioned in the emission area EMA or may be positioned in the second opening OP2 of the first bank BNK1.

The first alignment electrode ALE1 may be electrically connected to the first pixel electrode PE1 through a first contact hole CH1 in the second opening OP2 of the first bank BNK1. The second alignment electrode ALE2 may be electrically connected to the second pixel electrode PE2 through a second contact hole CH2 in the second opening OP2 of the first bank BNK1.

Each of the first alignment electrode ALE1 and the second alignment electrode ALE2 may receive a signal (or an alignment signal) from an alignment pad (not shown) positioned in the non-display area NDA in an alignment step of the light emitting elements LD. For example, the first alignment electrode ALE1 may receive a first alignment signal (or a first alignment voltage) from a first alignment pad, and the second alignment electrode ALE2 may receive a second alignment signal (or a second alignment voltage) from a second alignment pad. The above-described first and second alignment signals may be signals having a voltage difference and/or a phase difference to a degree that the light emitting elements LD may be aligned between the first and second alignment electrodes ALE1 and ALE2. At least one of the first and second alignment signals may be an AC signal, but is not limited thereto.

Each alignment electrode ALE may be provided in a bar shape (or "I" shape) having a constant width in the second direction DR2, but is not limited thereto. According to one or more embodiments, each alignment electrode ALE may or may not have a curved portion in the non-emission area NEMA and/or the second opening OP2 of the bank BNK, which is the electrode separation area, and a shape and/or a size of each alignment electrode ALE in remaining areas except for the emission area EMA are/is not particularly limited and may be variously changed.

A bank pattern (not shown), which is a structure that precisely defines (or prescribes) alignment positions of the light emitting elements LD in the emission area EMA of the pixel PXL, may be positioned on the above-described alignment electrode ALE. Such a bank pattern is described later with reference to FIGS. 7 to 14.

At least two to tens of light emitting elements LD may be arranged and/or provided in the emission area EMA (or the pixel area PXA), but the number of the light emitting elements LD is limited thereto. According to one or more embodiments, the number of light emitting elements LD arranged and/or provided in the emission area EMA (or the pixel area PXA) may be variously changed.

The light emitting elements LD may be disposed between the first alignment electrode ALE1 and the second alignment electrode ALE2. Each of the light emitting elements LD may be the light emitting element LD described with reference to FIG. 1. Each of the light emitting elements LD may include the first end EP1 (or an end) and the second end EP2 (or another end) positioned at ends thereof in the longitudinal direction. In one or more embodiments, the second semiconductor layer 13 including the p-type semiconductor layer may be positioned at the first end EP1, and the first semiconductor layer 11 including the n-type semiconductor layer may be positioned at the second end EP2. The light emitting elements LD may be electrically connected in parallel between the first alignment electrode ALE1 and the second alignment electrode ALE2.

Each of the light emitting elements LD may emit any one of color light and/or white light. Each of the light emitting elements LD may be aligned between the first alignment electrode ALE1 and the second alignment electrode ALE2 so that the length direction is parallel to the first direction DR1. According to one or more embodiments, at least some of the light emitting elements LD may be aligned between the first alignment electrode ALE1 and the second alignment electrode ALE2 so as not to be completely parallel to the first direction DR1. For example, some of the light emitting elements LD may be aligned between the first alignment electrode ALE1 and the second alignment electrode ALE2 so as to be inclined with respect to the first direction DR1. The light emitting elements LD may be provided in a form dispersed in a solution (or ink) and input (or supplied) to the pixel area PXA (or the emission area EMA).

The light emitting elements LD may be input (or supplied) to the pixel area PXA (or the emission area EMA) by an inkjet printing method, a slit coating method, or other various methods. For example, the light emitting elements LD may be mixed with a volatile solvent and input (or supplied) to the pixel area PXA by an inkjet printing method or a slit coating method. In case that an alignment signal corresponding to each of the first alignment electrode ALE1 and the second alignment electrode ALE2 is applied, an electric field may be formed between the first alignment electrode ALE1 and the second alignment electrode ALE2. Accordingly, the light emitting elements LD may be aligned between the first alignment electrode ALE1 and the second alignment electrode ALE2. After the light emitting elements LD are aligned, the light emitting elements LD may be stably aligned between the first alignment electrode ALE1 and the second alignment electrode ALE2 by volatilizing the solvent or removing the solvent by other methods.

The pixel electrodes PE (or electrodes) are provided at least in the emission area EMA, and may be provided at a position corresponding to at least one alignment electrode ALE and the light emitting element LD, respectively. For example, each pixel electrode PE may be formed on each alignment electrode ALE and the corresponding light emitting elements LD to overlap each alignment electrode ALE and the corresponding light emitting elements LD, and may be electrically connected to at least the light emitting elements LD.

The first pixel electrode PE1 ("first electrode" or "anode") may be formed on the first alignment electrode ALE1 and the first end EP1 of each of the light emitting elements LD, and may be electrically connected to the first end EP1 of each of the light emitting elements LD. In addition, the first pixel electrode PE1 may directly contact the first alignment electrode ALE1 through the first contact hole CH1 at least in the non-emission area NEMA, for example, in the second opening OP2 which is the electrode separation area, to be electrically and/or physically connected to the first alignment electrode ALE1. The first contact hole CH1 may be formed by removing a portion of at least one insulating layer positioned between the first pixel electrode PE1 and the first alignment electrode ALE1, and may expose a portion of the first alignment electrode ALE1.

The first contact hole CH1, which is a connection point (or a contact point) between the first pixel electrode PE1 and the first alignment electrode ALE1, is positioned in the second opening OP2 which is the electrode separation area of the non-emission area NEMA, but the disclosure is not limited thereto. According to one or more embodiments, the connection point (or the contact point) between the first pixel electrode PE1 and the first alignment electrode ALE1 may be positioned at least in the emission area EMA.

The first transistor T1, the first alignment electrode ALE1, and the first pixel electrode PE1 may be electrically connected to each other through the first contact portion CNT1 and the first contact hole CH1.

The first pixel electrode PE1 may have a bar shape extending in the second direction DR2, but is not limited thereto. According to one or more embodiments, the shape of the first pixel electrode PE1 may be variously changed within a range in which the first pixel electrode PE1 is electrically and/or physically connected to the first end EP1 of the light emitting elements LD stably. In addition, the shape of the first pixel electrode PE1 may be variously changed in consideration of a connection relationship with the first alignment electrode ALE1 disposed thereunder.

The second pixel electrode PE2 ("second electrode", or "cathode") may be formed on the second alignment electrode ALE2 and the second end EP2 of each of the light emitting elements LD, and may be electrically connected to the second end EP2 of each of the light emitting elements LD. In addition, the second pixel electrode PE2 may directly contact the second alignment electrode ALE2 through the second contact hole CH2 to be electrically and/or physically connected to the second alignment electrode ALE2. The second contact hole CH2 may be formed by removing a portion of at least one insulating layer positioned between the second pixel electrode PE2 and the second alignment electrode ALE2, and may expose a portion of the second alignment electrode ALE2. According to one or more embodiments, the second contact hole CH2 which is a connection point (or a contact point) between the second pixel electrode PE2 and the second alignment electrode AL2 may be positioned in the emission area EMA.

The second power line PL2, the second alignment electrode ALE2, and the second pixel electrode PE2 may be electrically connected to each other through the second contact portion CNT2 and the second contact hole CH2.

The second pixel electrode PE2 may have a bar shape extending in the second direction DR2, but is not limited thereto. According to one or more embodiments, the shape of the second pixel electrode PE2 may be variously changed within a range in which the second pixel electrode PE2 is electrically and/or physically connected to the second end EP2 of the light emitting elements LD stably. In addition, the shape of the second pixel electrode PE2 may be variously changed in consideration of a connection relationship with the second alignment electrode ALE2 disposed thereunder.

In one or more embodiments, because the first bank BNK1 positioned in the non-emission area NEMA of each pixel PXL is formed of the organic layer including the liquid repellent organic material, an area of the non-emission area NEMA in which the first bank BNK1 is positioned may become a hydrophobic area. The hydrophobic area may induce (or guide) ink only to areas (for example, areas corresponding to a print nozzle) determined as an ink ejection position of the corresponding pixels PXL in a step of ejecting the ink to each pixel PXL. For example, the first bank BNK1 including the liquid repellent organic material may be a structure that induces the ink in which the light emitting elements LD are dispersed in each pixel PXL to be positioned only in a specific area. The first bank BNK1 may impart hydrophobicity to an area of the non-emission area NEMA of each pixel PXL without a separate treatment process (for example, a plasma treatment process or the like) imparting liquid repellency.

Hereinafter, the stack structure of the pixel PXL according to the above-described embodiment is mainly described with reference to FIGS. 7 to 14.

Figure 7:
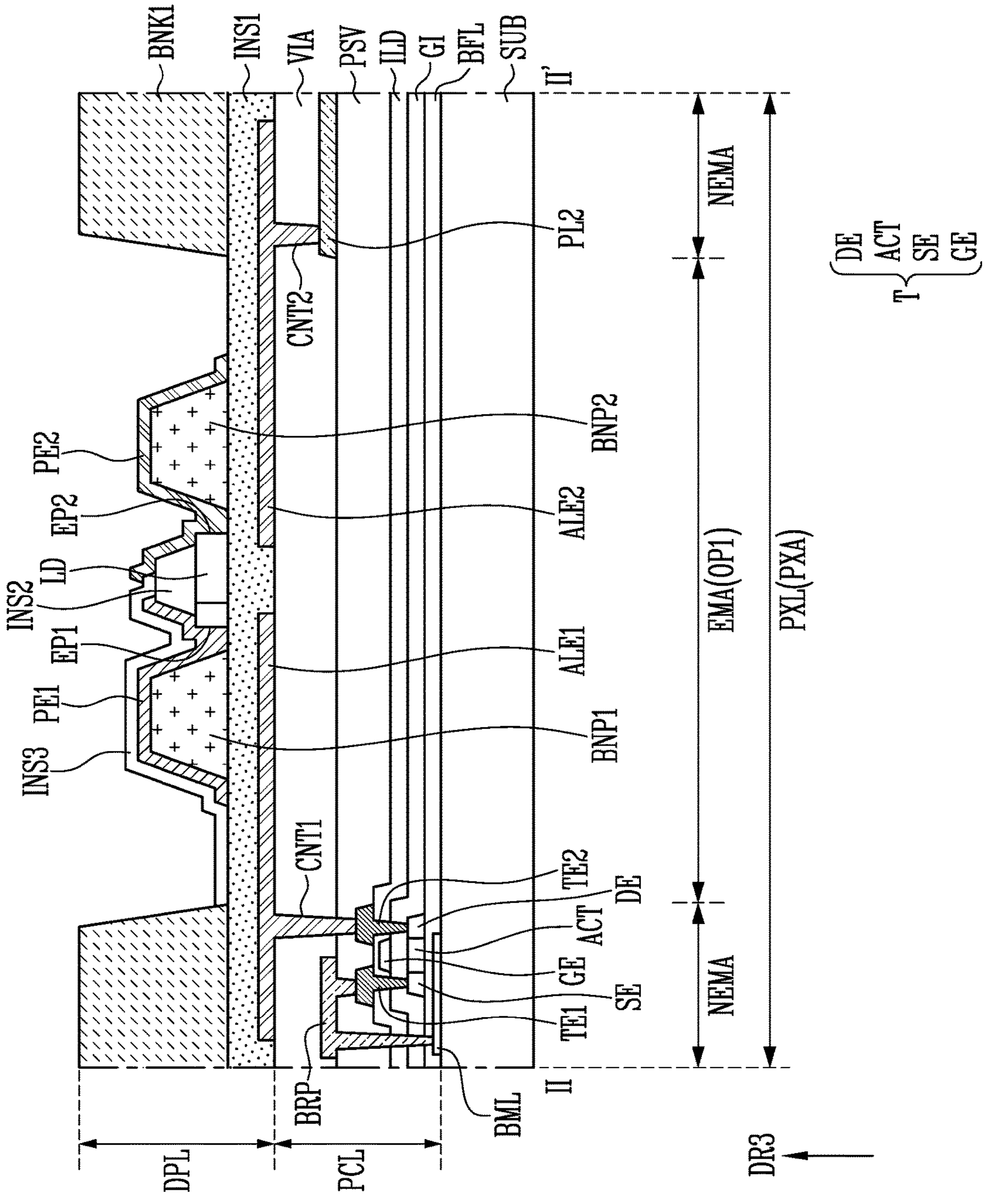
FIGS. 7 and 8 are schematic cross-sectional views taken along line II-II' of FIG. 6.
Figure 8:
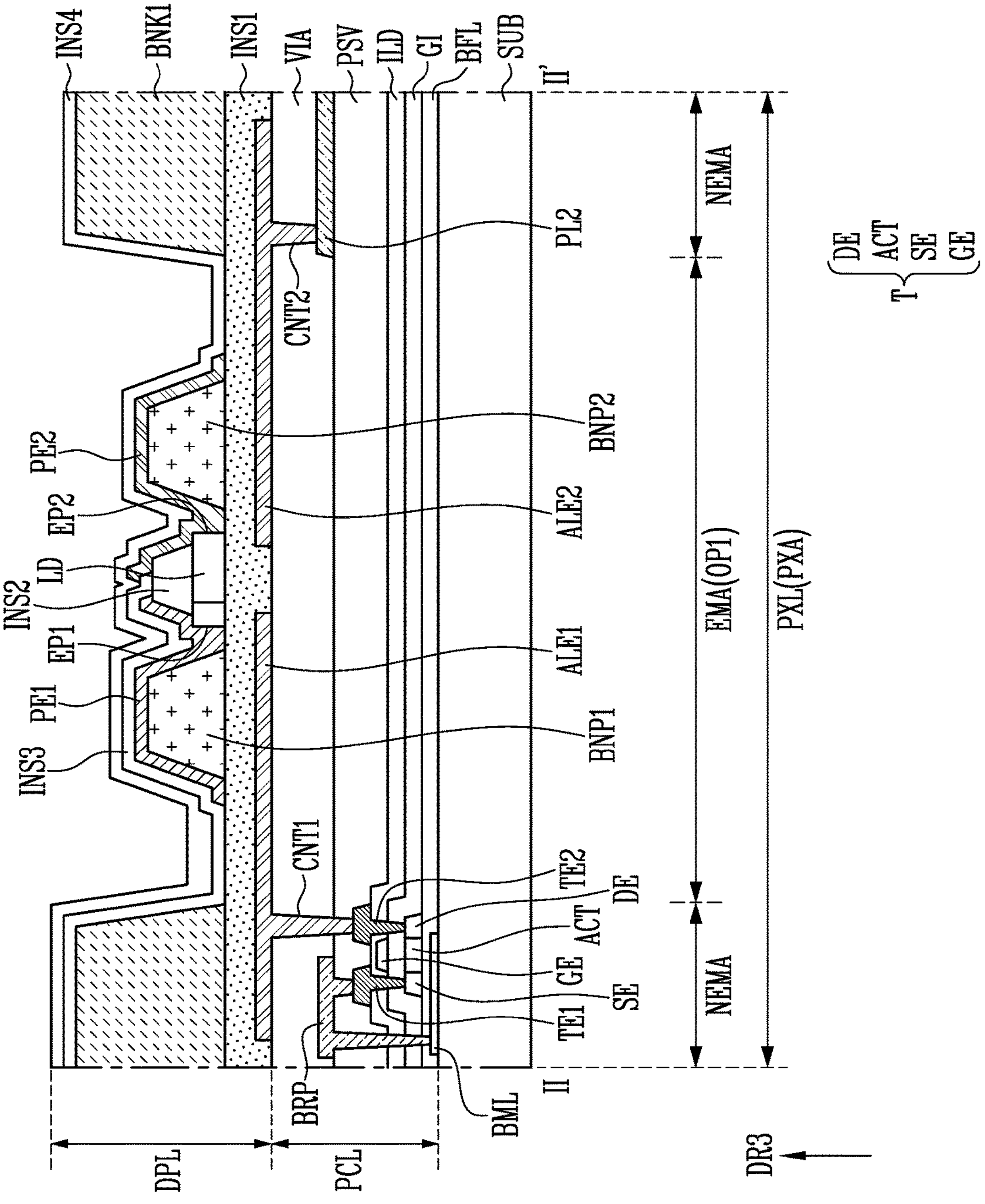
Figure 12:
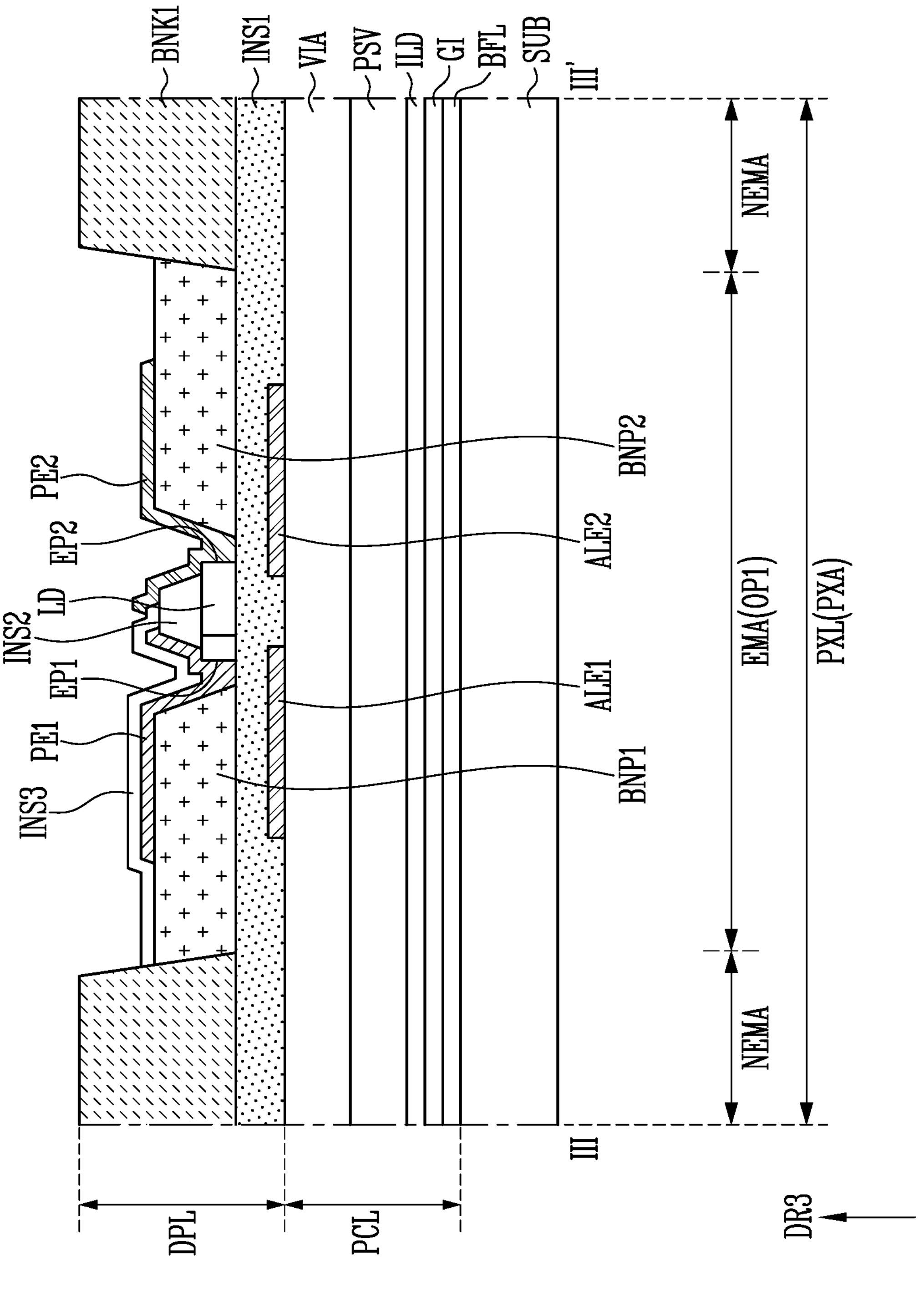
Figure 13:
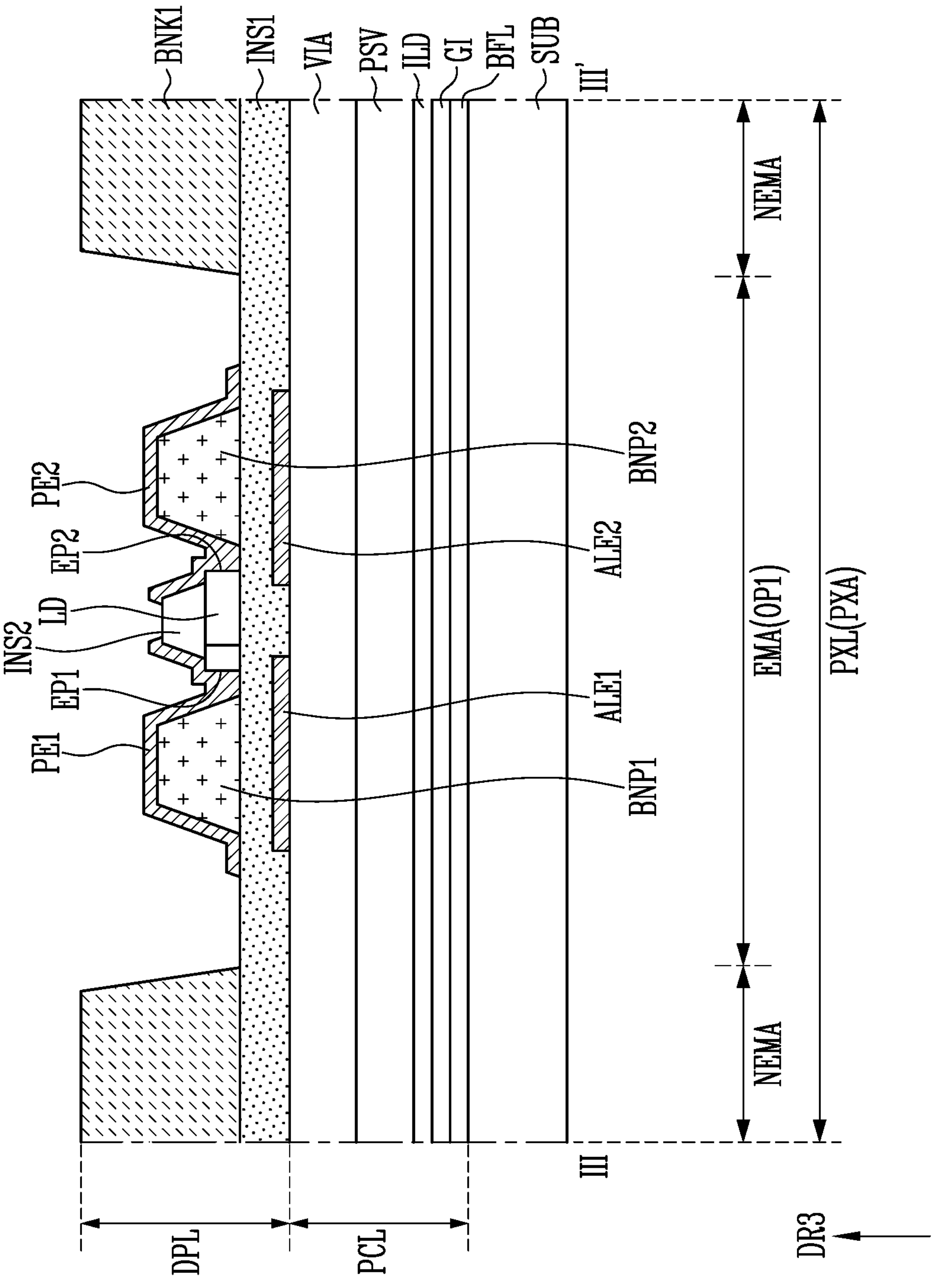
Figure 14:
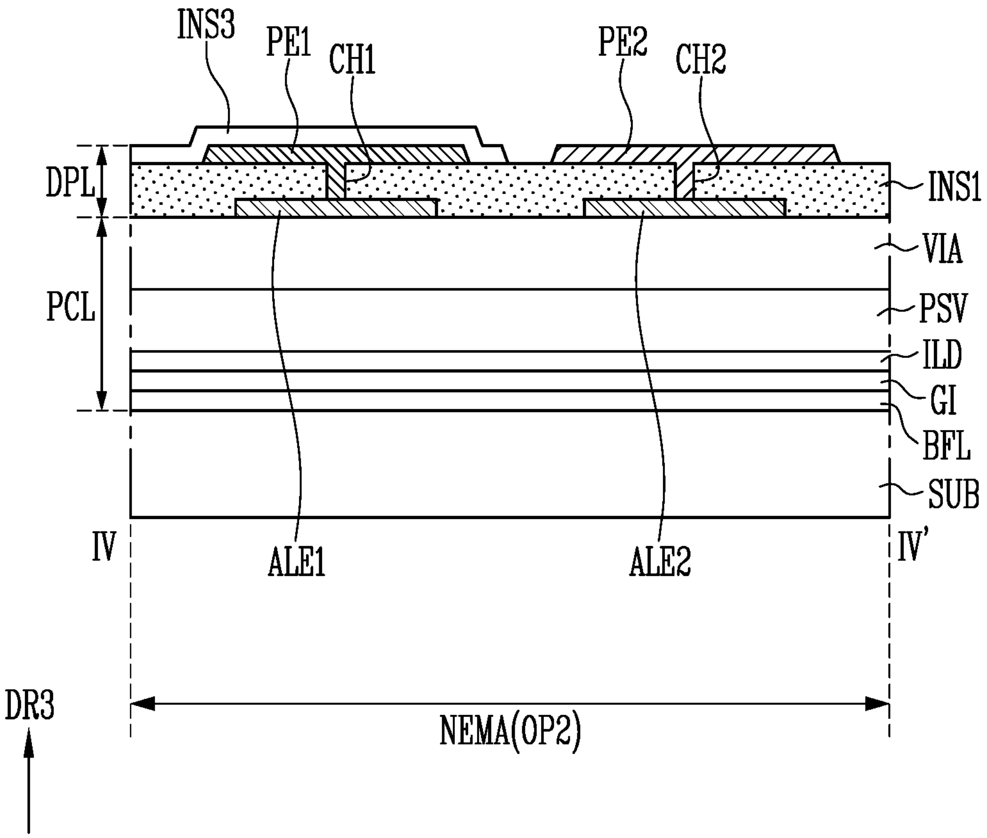

FIGS. 7 and 8 are schematic cross-sectional views taken along line II-II' of FIG. 6, FIGS. 9 to 13 are schematic cross-sectional views taken along line III-III' of FIG. 6, and FIG. 14 is a schematic cross-sectional view taken along line IV-IV' of FIG. 6.

In describing embodiments, "formed and/or provided on a same layer" means "formed by same process", and "formed and/or provided on a different layer" means "formed by different processes".

FIG. 8 illustrates a modified embodiment of FIG. 7 in relation to a fourth insulating layer INS4 disposed on the first and second pixel electrodes PE1 and PE2.

Figure 9:
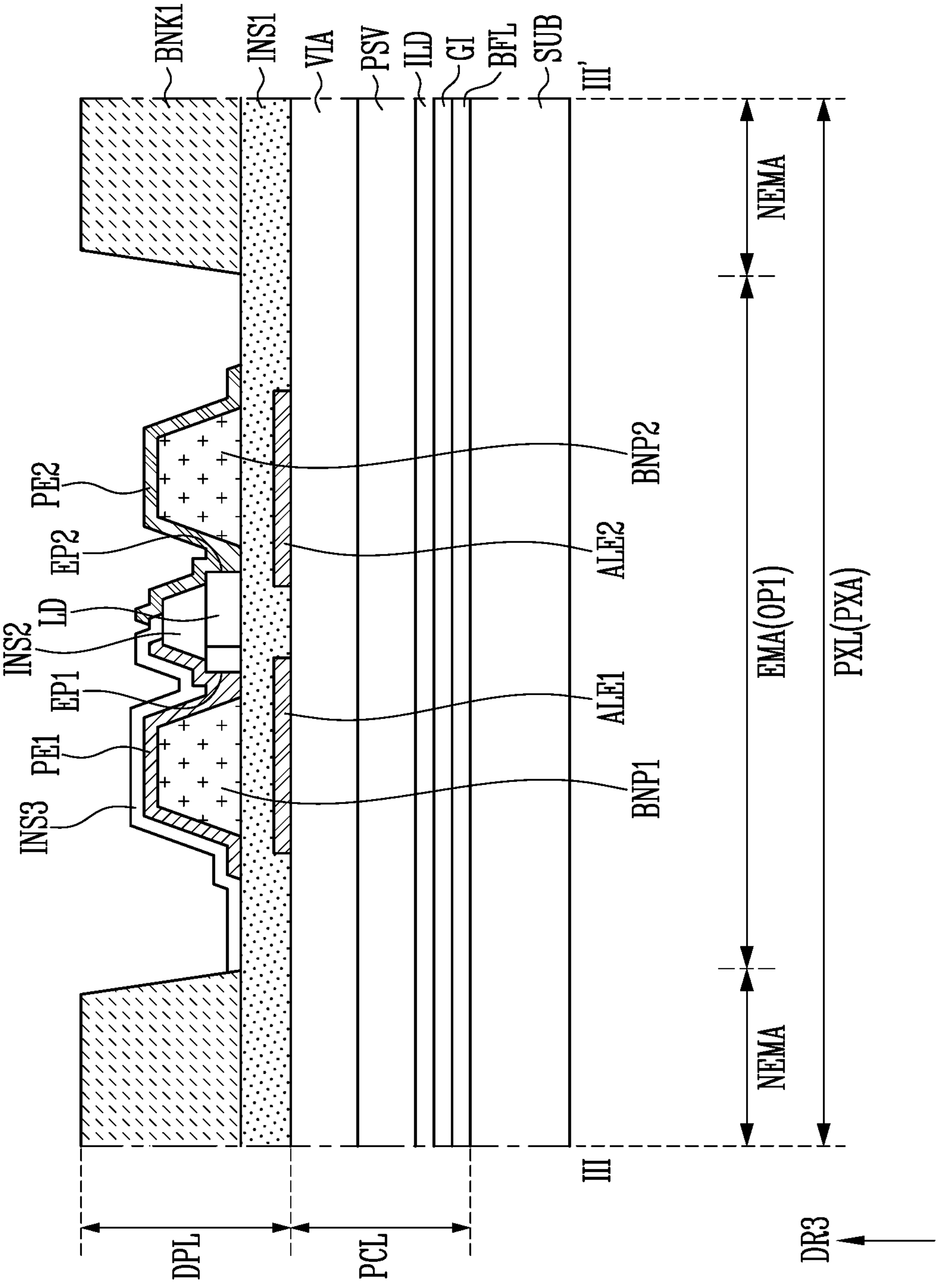
FIGS. 9 to 13 are schematic cross-sectional views taken along line III-III' of FIG. 6.
Figure 10:
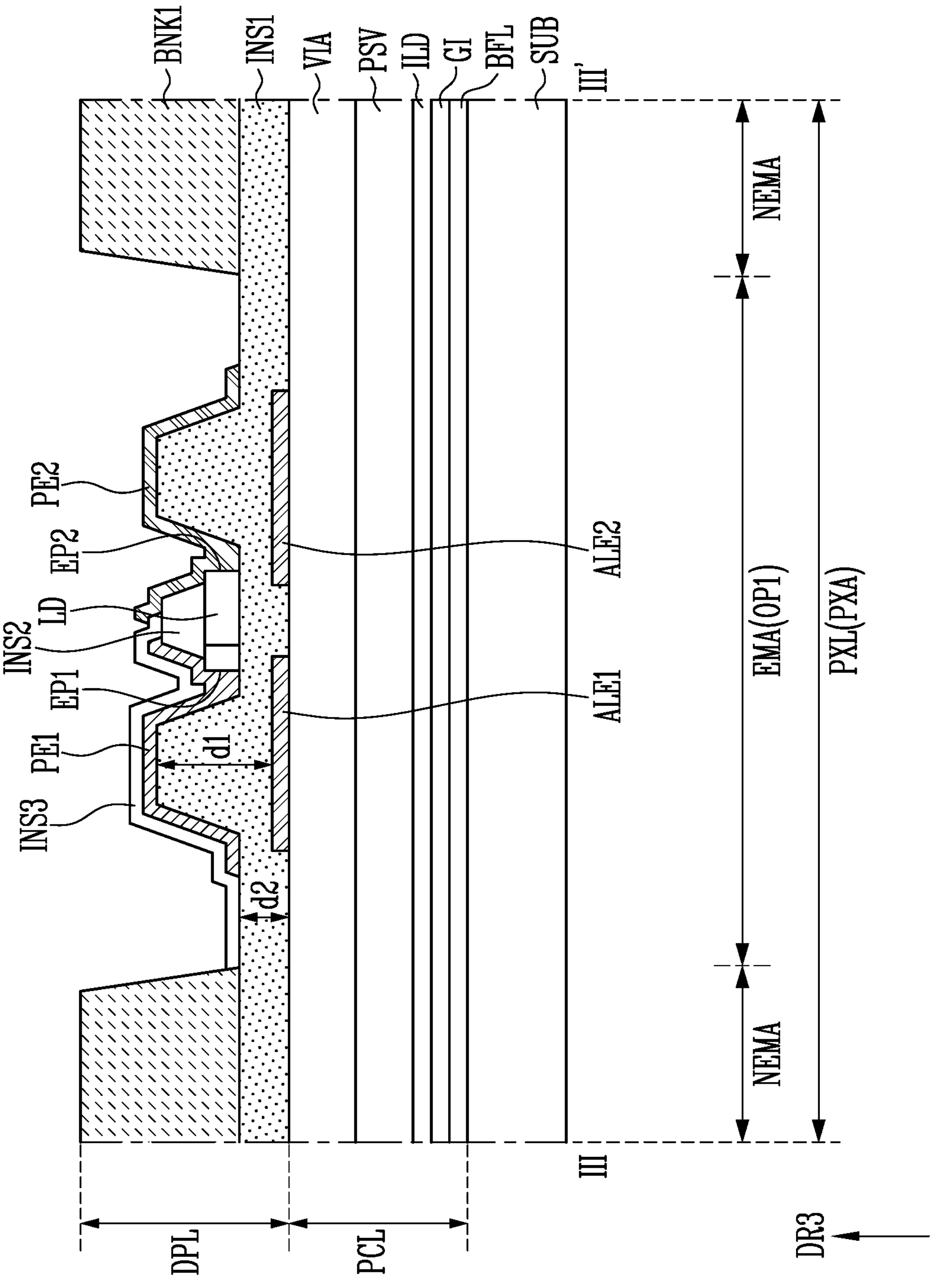
Figure 11:
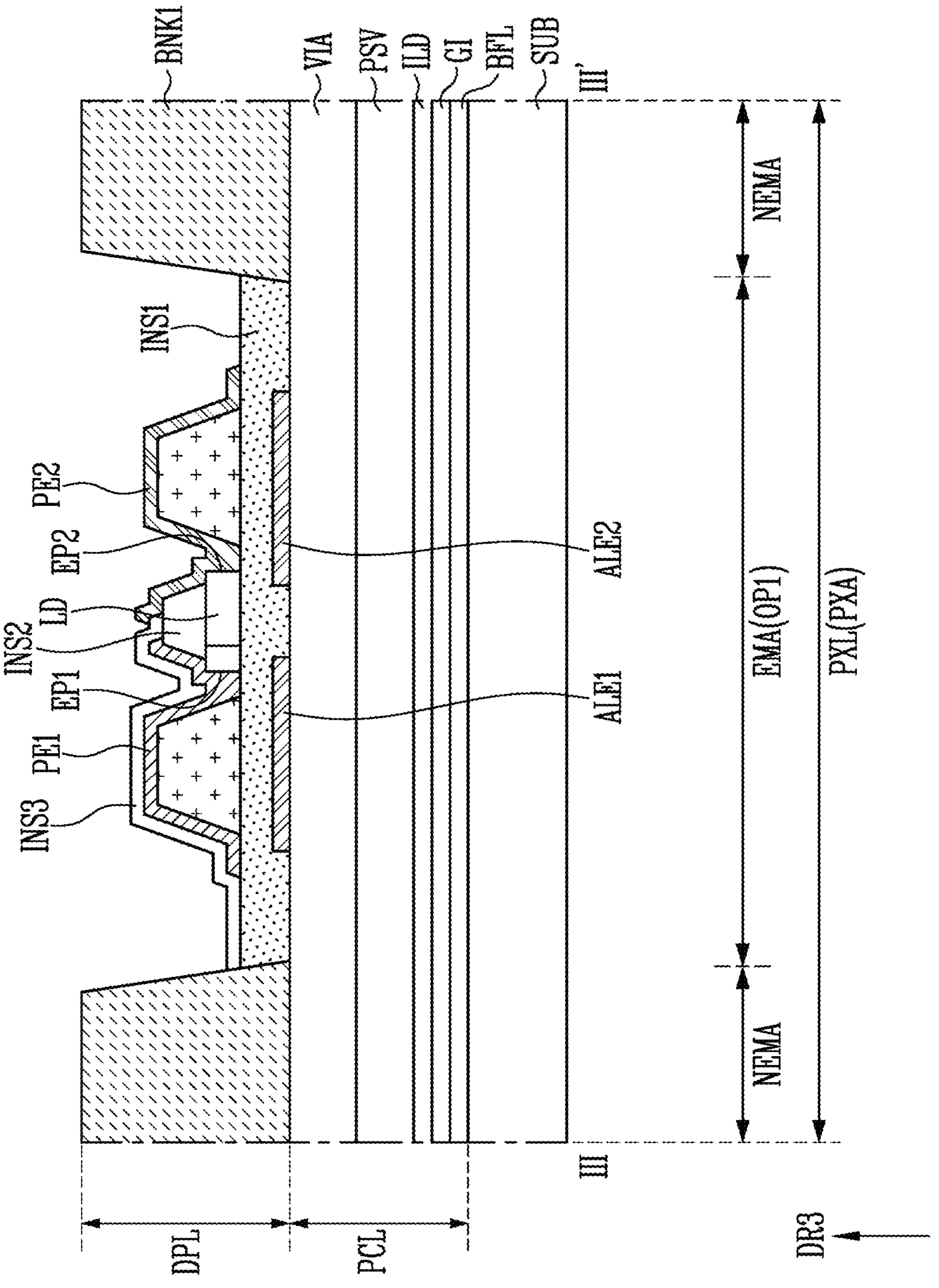

FIGS. 10 and 11 illustrate modified embodiments of FIG. 9 in relation to a first insulating layer INS1 and the like.

FIG. 12 illustrates a modified embodiment of FIG. 9 in relation to first and second bank patterns BNP1 and BNP2.

FIGS. 7 to 14 illustrate a vertical direction (or a thickness direction of the substrate SUB) in a cross-sectional view is denoted as a third direction DR3.

Referring to FIGS. 1 to 14, the pixel PXL may include the substrate SUB, a pixel circuit layer PCL, and a display element layer DPL.

The pixel circuit layer PCL and the display element layer DPL may be disposed on a surface of the substrate SUB to overlap each other. For example, the display area DA of the substrate SUB may include the pixel circuit layer PCL disposed on a surface of the substrate SUB and the display element layer DPL disposed on the pixel circuit layer PCL. However, mutual positions of the pixel circuit layer PCL and the display element layer DPL on the substrate SUB may vary according to one or more embodiments. In case that the pixel circuit layer PCL and the display element layer DPL are separated and overlapped as separate layers, each layout space for forming the pixel circuit PXC and the light emitting unit EMU may be sufficiently secured in a plan view.

The substrate SUB may include a transparent insulating material and may transmit light. The substrate SUB may be a rigid substrate or a flexible substrate.

For example, the rigid substrate may be one of a glass substrate, a quartz substrate, a glass ceramic substrate, and a crystalline glass substrate.

The flexible substrate may be one of a film substrate and a plastic substrate including a polymer organic material. For example, the flexible substrate may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

In each pixel area PXA of the pixel circuit layer PCL, circuit elements (for example, transistors T) forming the pixel circuit PXC of the corresponding pixel PXL and signal lines electrically connected to the circuit element may be disposed. In addition, in each pixel area PXA of the display element layer DPL, the alignment electrode ALE, the light emitting elements LD, and/or the pixel electrodes PE forming the light emitting unit EMU of the corresponding pixel PXL may be disposed.

The pixel circuit layer PCL may include at least one insulating layer in addition to the circuit elements and the signal lines. For example, the pixel circuit layer PCL may include a buffer layer BFL, a gate insulating layer GI, an interlayer insulating layer ILD, a passivation layer PSV, and a via layer VIA sequentially stacked on the substrate SUB in the third direction DR3.

The buffer layer BFL may be provided and/or formed entirely on the substrate SUB. The buffer layer BFL may prevent an impurity from diffusing into the transistor T included in the pixel circuit PXC. The buffer layer BFL may be an inorganic insulating layer including an inorganic material. The buffer layer BFL may include at least one metal oxide such as silicon nitride ($SiN_x$), silicon oxide ($SiO_x$), silicon oxynitride ($SiO_xN_y$), and aluminum oxide ($AlO_x$). The buffer layer BFL may be provided as a single layer, or may be provided as multiple layers of at least double layers. In case that the buffer layer BFL is provided as multiple layers, each layer may be formed of a same material or may be formed of different materials. The buffer layer BFL may be omitted according to the material, a process condition, and the like of the substrate SUB.

The gate insulating layer GI may be entirely disposed on the buffer layer BFL. The gate insulating layer GI and the above-described buffer layer BFL may include a same material, or the gate insulating layer GI may include a suitable material among the materials that may be used to form the buffer layer BFL, e.g., as described herein. For example, the gate insulating layer GI may be an inorganic insulating layer including an inorganic material.

The interlayer insulating layer ILD may be entirely provided and/or formed on the gate insulating layer GI. The interlayer insulating layer ILD and the gate insulating layer GI may include a same material, or the interlayer insulating layer ILD may include one or more materials selected from the materials that may be used to form the gate insulating layer GI, e.g., as described herein.

The passivation layer PSV may be entirely provided and/or formed on the interlayer insulating layer ILD. The passivation layer PSV may be an organic layer (or an inorganic insulating layer) including an inorganic material or an organic layer (or an organic insulating layer) including an organic material. The inorganic layer may include, for example, at least one of a metal oxide such as silicon nitride ($SiN_x$), silicon oxide ($SiO_x$), silicon oxynitride ($SiO_xN_y$), and aluminum oxide ($AlO_x$). The organic layer may include, for example, at least one of an acrylic resin (or polyacrylates resin), an epoxy resin, a phenolic resin, a polyamide resin, a polyimide resin, an unsaturated polyester resin, a polyphenylene ethers resin, a polyphenylene sulfides resin, and a benzocyclobutene resin.

The passivation layer PSV may be partially opened to include a partial configuration of the pixel circuit PXC, for example, the first contact portion CNT1 exposing an area of a second connection member TE2. In addition, the passivation layer PSV may be partially opened to expose other configurations of the pixel circuit PXC, for example, an area of a first connection member TE1 and an area of a bottom metal layer BML.

According to one or more embodiments, the passivation layer PSV and the interlayer insulating layer ILD may include a same material, but is not limited thereto. The passivation layer PSV may be provided as a single layer, or may also be provided as multiple layers of at least double layers or more.

The via layer VIA may be entirely provided and/or formed on the passivation layer PSV. The via layer VIA may be formed as a single layer including an organic layer or multiple layers of double layers or more. According to one or more embodiments, the via layer VIA may be provided in a form including an inorganic layer and an organic layer disposed on the inorganic layer. In case that the via layer VIA is provided as the multiple layers of the double layers of more, the organic layer forming the via layer VIA may be positioned on the uppermost layer. The via layer VIA may include at least one of an acrylic resin (or polyacrylates resin), an epoxy resin, a phenolic resin, a polyamide resin, a polyimide resin, an unsaturated polyester resin, a polyphenylene ethers resin, a polyphenylene sulfides resin, and a benzocyclobutene resin.

The via layer VIA may include a first contact portion CNT1 corresponding to the first contact portion CNT1 of the passivation layer PSV and a second contact portion CNT2 exposing the second power line PL2. In one or more embodiments, the via layer VIA formed of the organic layer may be utilized as a planarization layer to alleviate a step difference generated by components (for example, transistors T, power lines, a bridge pattern BRP, and the like positioned thereunder in the pixel circuit layer PCL.

The pixel circuit layer PCL may include at least one conductive layer disposed between the above-described insulating layers. For example, the pixel circuit layer PCL may include a first conductive layer disposed between the substrate SUB and the buffer layer BFL, a second conductive layer disposed on the gate insulating layer GI, a third conductive layer disposed on the interlayer insulating layer ILD, and a fourth conductive layer disposed on the passivation layer PSV.

The first conductive layer may be formed as a single layer formed of at least one selected from a group consisting of copper (Cu), molybdenum (Mo), tungsten (W), aluminum neodymium (AlNd), titanium (Ti), aluminum (Al), silver (Ag), and an alloy thereof, alone or a mixture thereof, or may be formed in a double layer or multi-layer structure of molybdenum (Mo), titanium (Ti), copper (Cu), aluminum (Al), or silver (Ag), which are low-resistance materials to reduce a line resistance. Each of the second to fourth conductive layers and the first conductive layer may include a same material, or each of the second to fourth conductive layers may include one or more suitable materials among the materials that may be used to form the first conductive layer, e.g., as described herein, but is not limited thereto.

The pixel circuit PXC may include at least one transistor T for controlling a driving current of the light emitting elements LD. For example, the transistor T may be the first transistor T1 described with reference to FIGS. 4 and 5.

The transistor T may include a semiconductor pattern and a gate electrode GE overlapping a portion of the semiconductor pattern. Here, the semiconductor pattern may include an active pattern ACT, a first contact region SE, and a second contact region DE. The first contact region SE may be one of a source region and a drain region, and the second contact region DE may be the other of the source region and the drain region.

The gate electrode GE may be the second conductive layer disposed between the gate insulating layer GI and the interlayer insulating layer ILD.

The active pattern ACT, the first contact region SE, and the second contact region DE may be disposed between the buffer layer BFL and the gate insulating layer GI, and may be a semiconductor pattern formed of polysilicon, amorphous silicon, an oxide semiconductor, or the like. The active pattern ACT, the first contact region SE, and the second contact region DE may be formed as a semiconductor layer that is not doped with an impurity or is doped with an impurity. For example, the first contact region SE and the second contact region DE may be formed as a semiconductor layer doped with an impurity, and the active pattern ACT may be formed as a semiconductor layer that is not doped with an impurity. As an impurity, for example, an n-type impurity may be used, but is not limited thereto.

The active pattern ACT may be a region overlapping the gate electrode GE of the transistor T and may be a channel region.

The first contact region SE may be electrically connected to (or in contact with) an end of the active pattern ACT of the transistor T. In addition, the first contact region SE may be electrically connected to the bridge pattern BRP through the first connection member TE1.

The first connection member TE1 may be the third conductive layer disposed between the interlayer insulating layer ILD and the passivation layer PSV. An end of the first connection member TE1 may be electrically and/or physically connected to the first contact region SE through a contact hole sequentially passing through the interlayer insulating layer ILD and the gate insulating layer GI. In addition, another end of the first connection member TE1 may be electrically and/or physically connected to the bridge pattern BRP through a contact hole passing through the passivation layer PSV positioned on the interlayer insulating layer ILD.

The bridge pattern BRP may be the fourth conductive layer disposed between the passivation layer PSV and the via layer VIA. An end of the bridge pattern BRP may be electrically connected to the first contact region SE through the first connection member TEL In addition, another end of the bridge pattern BRP may be electrically and/or physically connected to the bottom metal layer BML through a contact hole sequentially passing through the passivation layer PSV, the interlayer insulating layer ILD, the gate insulating layer GI, and the buffer layer BFL. The bottom metal layer BML and the first contact region SE may be electrically connected to each other through the bridge pattern BRP and the first connection member TEL The bottom metal layer BML may be the first conductive layer. For example, the bottom metal layer BML may be a conductive layer positioned between the substrate SUB and the buffer layer BFL. The bottom metal layer BML may be electrically connected to the transistor T to widen a driving range of a voltage (e.g., a predetermined or selected voltage) supplied to the gate electrode GE. For example, the bottom metal layer BML may be electrically connected to the first contact region SE to stabilize the channel region of the transistor T. In addition, as the bottom metal layer BML is electrically connected to the first contact region SE, floating of the bottom metal layer BML may be prevented.

The second contact region DE may be electrically connected to (or contact) another end of the active pattern ACT of the transistor T. In addition, the second contact region DE may be connected to (or contact) the second connection member TE2.

The second connection member TE2 may be the third conductive layer. An end of the second connection member TE2 may be electrically and/or physically connected to the second contact region DE of the transistor T through a contact hole passing through the interlayer insulating layer ILD and the gate insulating layer GI. Another end of the second connection member TE2 may be electrically and/or physically connected to the first alignment electrode ALE1 of the display element layer DPL through the first contact portion CNT1 sequentially passing through the via layer VIA and the passivation layer PSV. In one or more embodiments, the second connection member TE2 may be a connection means for connecting the transistor T of the pixel circuit layer PCL and the first alignment electrode ALE1 of the display element layer DPL.

In the above-described embodiment, a case in which the transistor T is a thin-film transistor having a top gate structure is described as an example, but the disclosure is not limited thereto, and a structure of the transistor T may be variously changed.

The passivation layer PSV may be provided and/or formed on the transistor T and the first and second connection members TE1 and TE2.

The pixel circuit layer PCL may include a power line provided and/or formed on the passivation layer PSV. For example, the power line may include the second power line PL2. The second power line PL2 may be disposed between the passivation layer PSV and the via layer VIA. The voltage of the second driving power VSS may be applied to the second power line PL2. Although not directly shown in FIGS. 7 to 14, the pixel circuit layer PCL may further include the first power line PL1 described with reference to FIGS. 4 and 5. The first power line PL1 and the second power line PL2 may be provided on a same layer or may be provided on different layers. In the above-described embodiment, the second power line PL2 is provided and/or formed on the passivation layer PSV, but the disclosure is not limited thereto. According to one or more embodiments, the second power line PL2 may be provided on an insulating layer in which any one of the first to fourth conductive layers included in the pixel circuit layer PCL is disposed. For example, the position of the second power line PL2 may be variously changed in the pixel circuit layer PCL.

The via layer VIA may be provided and/or formed on the bridge pattern BRP and the second power line PL2. The display element layer DPL may be disposed on the via layer VIA.

The display element layer DP may include the alignment electrodes ALE, the bank patterns BNP1 and BNP2, the first bank BNK1, the light emitting elements LD, and the pixel electrodes PE. In addition, the display element layer DPL may include at least one or more insulating layers positioned between the above-described configurations.

The alignment electrodes ALE may be provided and/or formed on the via layer VIA. The alignment electrodes ALE may be disposed on a same plane and may have a same thickness in the third direction DR3. The alignment electrodes ALE may be simultaneously formed by a same process.

The alignment electrodes ALE may be formed of a material having a reflectance in order to allow the light, emitted from the light emitting elements LD, to proceed in an image display direction (or a frontal direction) of the display device. For example, the alignment electrodes ALE may be formed of a conductive material (or substance). The conductive material may include an opaque metal suitable for reflecting the light emitted from the light emitting elements LD in the image display direction of the display device. The opaque metal may include, for example, a metal such as silver (Ag), magnesium (Mg), aluminum (Al), platinum (Pt), palladium (Pd), gold (Au), nickel (Ni), neodymium (Nd), iridium (Ir), chromium (Cr), titanium (Ti), and an alloy thereof. However, the material of the alignment electrodes ALE is not limited to the above-described embodiment. According to one or more embodiments, the alignment electrodes ALE may include a transparent conductive material (or substance). The transparent conductive material (or substance) may include a conductive oxide such as indium tin oxide (ITO), indium zinc oxide (IZO), zinc oxide ($ZnO_x$), indium gallium zinc oxide (IGZO), and indium tin zinc oxide (ITZO), a conductive polymer such as poly(3,4-ethylenedioxythiophene) (PEDOT), and the like. In case that the alignment electrodes ALE include a transparent conductive material (or substance), a separate conductive layer formed of an opaque metal for reflecting the light emitted from the light emitting elements LD in the image display direction of the display device may be added. However, the material of the alignment electrodes ALE is not limited to the above-described materials.

Each of the alignment electrodes ALE may be provided and/or formed as a single layer, but is not limited thereto. According to one or more embodiments, each of the alignment electrodes ALE may be provided and/or formed as multiple layers in which at least two materials among metals, alloys, a conductive oxide, and conductive polymers are stacked. Each of the alignment electrodes ALE may be formed as multiple layers of at least double layers or more in order to minimize distortion due to signal delay in case that the alignment electrode ALE transmits a signal (or a voltage) to the first and second ends EP1 and EP2 of each of the light emitting elements LD. For example, each of the alignment electrodes ALE may be formed as multiple layers selectively further including at least one of at least one reflective electrode layer, at least one transparent electrode layer disposed on and/or under the reflective electrode layer, and at least one conductive capping layer covering the reflective electrode layer and/or the transparent electrode layer.

As described above, in case that the alignment electrodes ALE are formed of a conductive material having a reflectance, the light emitted from the ends of each of the light emitting elements LD, for example, the first and second ends EP1 and EP2 may further proceed in the image display direction of the display device.

The first alignment electrode ALE1 may be electrically connected to the first transistor T1 of the pixel circuit layer PCL through the first contact portion CNT1, and the second alignment electrode ALE2 may be electrically connected to the second power line PL2 of the pixel circuit layer PCL through the second contact portion CNT2.

The first insulating layer INS1 may be provided and/or formed on the alignment electrodes ALE.

The first insulating layer INS1 may be disposed on the alignment electrodes ALE and the via layer VIA. The first insulating layer INS1 may be partially opened to expose configurations positioned thereunder at least in the non-emission area NEMA. As an example, as shown in FIG. 14, the first insulating layer INS1 may be partially opened to include a first contact hole CH1 formed by removing an area at least in the non-emission area NEMA, and exposing a portion of the first alignment electrode ALE1 and a second contact hole CH2 formed by removing another area at least in the non-emission area NEMA, and exposing a portion of the second alignment electrode ALE2. Here, the at least non-emission area NEMA may be the second opening OP2 of the first bank BNK1 which is the electrode separation area, but is not limited thereto.

The first insulating layer INS1 may be formed as an organic layer including an organic material. For example, the first insulating layer INS1 may be formed as an organic layer suitable for planarizing a support surface of the light emitting elements LD while alleviating a step difference generated by configurations disposed thereunder, for example, the first and second alignment electrodes ALE1 and ALE2. As the first insulating layer INS1 is formed as the organic layer, a surface (or an upper surface) of the first insulating layer INS1 may have a flat profile (or surface). In one or more embodiments, the first insulating layer INS1 may be an organic layer including a lyophilic (or liquid contact) organic material. For example, the first insulating layer INS1 may include a material of which a surface energy with ink is different from a surface energy between the first bank BNK1 and the ink. For example, the first insulating layer INS1 may include a lyophilic organic material having a contact angle of about 5° to about 30° in case that a water droplet is dropped on the surface thereof, but is not limited thereto. A lyophilic property may mean a property or the like of being wetted with an organic solvent, water, or the like, which is a liquid derived from an inkjet device.

As described above, the first insulating layer INS1 including the lyophilic organic material may be provided on the via layer VIA, which is formed as the organic layer, to contact the via layer VIA.

The first insulating layer INS1 may be entirely disposed over the emission area EMA and the non-emission area NEMA of each pixel PXL, but the disclosure is not limited thereto. According to one or more embodiments, as in one or more embodiments of FIG. 11, the first insulating layer INS1 may be positioned only in a specific area of each pixel PXL, for example, the emission area EMA. In this case, the via layer VIA may be surrounded by the first insulating layer INS1 at least in the emission area EMA, and the via layer VIA may be exposed at least in the non-emission area NEMA. In case that the first bank BNK1 is directly disposed on the exposed via layer VIA, the first bank BNK1 may not overlap the first insulating layer INS1. However, the disclosure is not limited thereto, and the first bank BNK1 may be directly disposed on the exposed via layer VIA and overlap the first insulating layer INS1. In case that the first bank BNK1 is directly disposed on the via layer VIA, the via layer VIA, the first bank BNK1, and the first insulating layer INS1 may be sequentially provided and/or formed based on a surface of the substrate SUB. For example, the first bank BNK1 having liquid repellency may be formed on the via layer VIA of the non-emission area NEMA, and the first insulating layer INS1 having a lyophilic property may be formed on the via layer VIA of the emission area EMA by a successive process. In the embodiment of FIG. 11, the first bank BNK1 is first formed on the via layer VIA of the non-emission area NEMA, and the first insulating layer INS1 is formed on the via layer VIA of the emission area EMA, but the disclosure is not limited thereto. A reverse case may also be possible according to one or more embodiments. For example, in the embodiment of FIG. 11, the first insulating layer INS1 having the lyophilic property may be first formed on the via layer VIA of the emission area EMA, and the first bank BNK1 having the liquid repellency may be formed on the via layer VIA of the non-emission area NEMA.

The bank patterns BNP1 and BNP2 and the first bank BNK1 may be disposed on the first insulating layer INS1.

The first bank BNK1 may be disposed on the first insulating layer INS1 at least in the non-emission area NEMA, but the disclosure is not limited thereto. According to one or more embodiments, the first bank BNK1 may be disposed on the via layer VIA at least in the non-emission area NEMA. The first bank BNK1 may be formed between adjacent pixels PXL to surround the emission area EMA of each pixel PXL to form a pixel defining layer partitioning the emission area EMA of the corresponding pixel PXL. The first bank BNK1 may be a dam structure that prevents the solution (or ink) in which the light emitting elements LD are mixed is flowed into the emission area EMA of the adjacent pixels PXL or controls the supply of an amount of solution to each emission area EMA in a step of supplying the light emitting elements LD to the emission area EMA.

The first bank BNK1 may be an organic layer including a liquid repellent organic material. The liquid repellent organic material may include, for example, a photosensitive resin composition in which a liquid repellent agent is mixed with a photosensitive resin composition, but is not limited thereto. The liquid repellent agent may include a fluorine-based liquid repellent agent, but is not limited thereto. The first bank BNK1 may include a liquid repellent resist composition including a fluorine-based polymer in a photosensitive acrylic resin. For example, the first bank BNK1 may include a liquid repellent organic material having a contact angle of about 60° to about 130° in case that a water droplet is dropped on a surface thereof, but is not limited thereto. The liquid repellency may mean, for example, a property or the like of repelling an organic solvent, which is a liquid derived from an inkjet device.

In one or more embodiments, the terms “liquid repellency” and “lyophilic property” may be used in relative meanings.

The bank patterns BNP1 and BNP2 (or wall patterns) may be disposed on the first insulating layer INS1 on the alignment electrode ALE. In one or more embodiments, the bank patterns BNP1 and BNP2 may include a first bank pattern BNP1 and a second bank pattern BNP2. The first bank pattern BNP1 may be provided and/or formed on the first insulating layer INS1 to correspond to the first alignment electrode ALE1 at least in the emission area EMA, and the second bank pattern BNP2 may be provided and/or formed on the first insulating layer INS1 to correspond to the second alignment electrode ALE2 in the emission area EMA.

The first bank pattern BNP1 may be formed as a separate pattern that is individually disposed on the first insulating layer INS1 on the first alignment electrode ALE1 to overlap a portion of the first alignment electrode ALE1, but the disclosure is not limited thereto. According to one or more embodiments, as shown in FIG. 12, the first bank pattern BNP1 may have an opening or a concave corresponding to an area between the first alignment electrode ALE1 and the second alignment electrode ALE2 in the emission area EMA, may be spaced apart from the second bank pattern BNP2, and may be formed as an integrated pattern entirely connected to (or extended to) the display area DA. For example, the first bank pattern BNP1 may be adjacent to the first end EP1 of each of the light emitting elements LD in the emission area EMA and may contact a side surface of the first bank BNK1.

The second bank pattern BNP2 may be formed as a separate pattern that is individually disposed on the first insulating layer INS1 on the second alignment electrode ALE2 to overlap a portion of the second alignment electrode ALE2, but the disclosure is not limited thereto. According to one or more embodiments, as shown in FIG. 12, the second bank pattern BNP2 may have an opening or a concave corresponding to an area between the first alignment electrode ALE1 and the second alignment electrode ALE2 in the emission area EMA, may be spaced apart from the first bank pattern BNP1, and may be formed as an integrated pattern entirely connected to the display area DA. For example, the second bank pattern BNP2 may be adjacent to the second end EP2 of each of the light emitting elements LD in the emission area EMA and may contact the side surface of the first bank BNK1.

The first and second bank patterns BNP1 and BNP2 may have a cross section of a trapezoid shape of which a width becomes narrower upward from a surface of the first insulating layer INS1 in the third direction DR3, but the disclosure is not limited thereto. According to one or more embodiments, the first and second bank patterns BNP1 and BNP2 may include a curved surface having a cross section of a semi-elliptical shape, a semi-circular shape (or a hemispherical shape), or the like in which a width becomes narrower upward from a surface of the first insulating layer INS1 in the third direction DR3. In a cross-sectional view, shapes of the first and second bank patterns BNP1 and BNP2 are not limited to the above-described embodiments and may be variously changed.

The first and second bank patterns BNP1 and BNP2 and the first insulating layer INS1 may include a same material. For example, the first and second bank patterns BNP1 and BNP2 may be formed as an organic layer including a lyophilic organic material. According to one or more embodiments, the first and second bank patterns BNP1 and BNP2 may be formed as a self-organizing layer (or a self-assembled monolayer) the liquid repellency of which is changed to a lyophilic property by light irradiation. The first and second bank patterns BNP1 and BNP2 may be formed by irradiating light (for example, ultraviolet rays) at a liquid repellent organic thin film (for example, a self-organizing layer formed of fluoroalkylsilane) and changing the property of an irradiation area to a lyophilic property.

According to one or more embodiments, the first insulating layer INS1 and the first and second bank patterns BNP1 and BNP2 may be integrally provided as shown in FIG. 10. For example, after an organic material layer including a lyophilic organic material is entirely formed on the via layer VIA and the alignment electrodes ALE, the first insulating layer INS1 including an area, which partially overlaps the first and second alignment electrodes ALE1 and ALE1 and has a first thickness d1, and the remaining area except for the area, which have a second thickness d2, may be formed using a halftone mask. In this case, the first thickness d1 may be greater than the second thickness d2. The area having the first thickness d1 in the first insulating layer INS1 may correspond to the first and second bank patterns BNP1 and BNP2 described above. In this case, the first and second bank patterns BNP1 and BNP2 may be regarded as a portion of the first insulating layer INS1.

The above-described first and second bank patterns BNP1 and BNP2 may be disposed to be spaced apart from each other at least in the emission area EMA to be utilized as a structure that accurately defines the alignment positions of the light emitting elements LD.

As the first insulating layer INS1 including the lyophilic organic material and first and second bank patterns BNP1 and BNP2 are positioned in the emission area EMA of each pixel PXL, the emission area EMA may be implemented as a hydrophilic area. In addition, as the first bank BNK1 including the liquid repellent organic material is positioned in the non-emission area NEMA of the corresponding pixel PXL, the non-emission area NEMA may be implemented as a liquid repellent (or hydrophobic) area.

The via layer VIA, the first insulating layer INS1, and the first and second bank patterns BNP1 and BNP2 formed as the organic layer may contact each other to form an organic stack structure. The organic stack structure may be directly connected to the first bank BNK1 formed as the organic layer. Accordingly, outgas generated in the organic stack structure may be discharged (or emitted) to the first bank BNK1. In one or more embodiments, the first bank BNK1 may discharge the outgas generated in the organic layers included in the pixel PXL. Therefore, components of the pixel PXL, for example, the display element layer DPL may be prevented from being deteriorated due to stay of the outgas in the organic layers.

The light emitting elements LD may be supplied and aligned in the emission area EMA in which the first bank pattern BNP1 and the second bank pattern BNP2 are formed. For example, the light emitting elements LD may be supplied (or input) to the emission area EMA by an inkjet printing method or the like, and the light emitting elements LD may be aligned between the alignment electrodes ALE by an electric field formed by a signal (or alignment signal) applied to each of the alignment electrodes ALE. For example, the light emitting elements LD may be aligned on a flat surface of the first insulating layer INS1 between the first bank pattern BNP1 on the first alignment electrode ALE1 and the second bank pattern BNP2 on the second alignment electrode ALE2.

A second insulating layer INS2 (or an insulating pattern) may be provided and/or formed on the light emitting elements LD in the emission area EMA. The second insulating layer INS2 may be provided and/or formed on the light emitting elements LD, may partially cover an outer circumferential surface (or a surface) of each of the light emitting elements LD, and may expose the first end EP1 and the second end EP2 of the light emitting elements LD to the outside.

The second insulating layer INS2 may include an inorganic insulating layer including an inorganic material or an organic insulating layer including an organic material. For example, the second insulating layer INS2 may include an inorganic insulating layer suitable for protecting the active layer 12 of each of the light emitting elements LD from external oxygen, moisture, and the like. However, the disclosure is not limited thereto, and the second insulating layer INS2 may be formed as an organic insulating layer including an organic material according to a design condition or the like of the display device to which the light emitting elements LD are applied. The second insulating layer INS2 may be configured as a single layer or multiple layers.

The light emitting elements LD may be prevented from being separated from an aligned position by forming the second insulating layer INS2 on the light emitting elements LD of which the alignment is completed in the pixel area PXA (or the emission area EMA) of the pixel PXL.

The pixel electrodes PE may be disposed on the light emitting elements LD, the second insulating layer INS2 on the light emitting elements LD, the first and second bank patterns BNP1 and BNP2, and the first insulating layer INS1 in at least the emission area EMA.

At least in the emission area EMA, the first pixel electrode PE1 may be disposed on the first end EP1 of each of the light emitting elements LD, the second insulating layer INS2 on the light emitting elements LD, the first bank pattern BNP1, and the first insulating layer INS1. The first pixel electrode PE1 may directly contact the first alignment electrode ALE1 through the first contact hole CH1 to be electrically connected to the first alignment electrode ALE1. In one or more embodiments, the first pixel electrode PE1 may be directly disposed on the first bank pattern BNP1.

At least in the emission area EMA, the second pixel electrode PE2 may be disposed on a second end EP2 of each of the light emitting elements LD, a second insulating layer INS2 on the light emitting elements LD, a second bank pattern BNP2, and the first insulating layer INS1. The second pixel electrode PE2 may be electrically connected to and directly contact the second alignment electrode ALE2 through the second contact hole CH2. In one or more embodiments, the second pixel electrode PE2 may be directly disposed on the second bank pattern BNP2.

The first pixel electrode PE1 and the second pixel electrode PE2 may be disposed on the second insulating layer INS2 on the light emitting elements LD to be spaced apart from each other.

The first pixel electrode PE1 and the second pixel electrode PE2 may be formed of various transparent conductive materials to allow the light emitted from each of the light emitting elements LD proceed in the image display direction (for example, the third direction DR3) of the display device without loss. For example, the first pixel electrode PE1 and the second pixel electrode PE2 may include at least one of various transparent conductive materials (or substances) including indium tin oxide (ITO), indium zinc oxide (IZO), zinc oxide ($ZnO_x$), indium gallium zinc oxide (IGZO), indium tin zinc oxide (ITZO), and the like, and may be formed to be substantially transparent or translucent to satisfy a transmittance (e.g., a predetermined or selected transmittance). However, the material of the first pixel electrode PE1 and the second pixel electrode PE2 is not limited to the above-described embodiment. According to one or more embodiments, the first pixel electrode PE1 and the second pixel electrode PE2 may be formed of various opaque conductive materials (or substances). The first pixel electrode PE1 and the second pixel electrode PE2 may be formed as a single layer or multiple layers.

In one or more embodiments, the first pixel electrode PE1 and the second pixel electrode PE2 may be formed by different processes and provided on different layers. In this case, a third insulating layer INS3 may be provided and/or formed between the first pixel electrode PE1 and the second pixel electrode PE2. The third insulating layer INS3 may be provided on the first pixel electrode PE1 and may cover the first pixel electrode PE1 (or prevent the first pixel electrode PE1 from being exposed to the outside) to prevent corrosion of the like of the first pixel electrode PE1. The third insulating layer INS3 may include an inorganic insulating layer formed of an inorganic material or an organic insulating layer formed of an organic material. For example, the third insulating layer INS3 may include at least one of a metal oxide such as silicon nitride ($SiN_x$), silicon oxide ($SiO_x$), silicon oxynitride ($SiO_xN_y$), and aluminum oxide ($AlO_x$), but is not limited thereto. In addition, the third insulating layer INS3 may be formed as a single layer or multiple layers.

The third insulating layer INS3 may be selectively provided. For example, as shown in FIG. 13, in case that the first pixel electrode PE1 and the second pixel electrode PE2 are formed by a same process and provided on a same layer, the third insulating layer INS3 may be omitted. In other words, in case that the first pixel electrode PE1 and the second pixel electrode PE2 are formed by a same process and disposed on the second insulating layer INS2 to be spaced apart from each other, the third insulating layer INS3 covering the first pixel electrode PE1 may be omitted.

As shown in FIG. 8, a fourth insulating layer INS4 may be selectively disposed on the first pixel electrode PE1 and the second pixel electrode PE2.

The fourth insulating layer INS4 may be an inorganic layer (or an inorganic insulating layer) including an inorganic material or an organic layer (or an organic insulating layer) including an organic material. For example, the fourth insulating layer INS4 may have a structure in which at least one inorganic layer or at least one organic layer is alternately stacked. The fourth insulating layer INS4 may entirely cover the display element layer DPL to prevent water, moisture, or the like from flowing into the display element layer DPL including the light emitting elements LD from the outside.

According to the above-described embodiment, before aligning the light emitting elements LD, the first insulating layer INS1 and the first and second bank patterns BNP1 and BNP2 having the lyophilic property may be formed in at least the emission area EMA and the first bank BNK1 having the liquid repellency may be formed in the non-emission area NEMA surrounding the emission area EMA. In this case, the pixel area PXA of each pixel PXL may be divided into a hydrophobic area and a hydrophilic area. The emission area EMA may become the hydrophilic area, and the non-emission area NEMA may become the hydrophobic area. In case that the ink in which the light emitting elements LD are dispersed is supplied to the pixel area PXA, the ink may form strong attractive force with the first insulating layer INS1, the first bank pattern BNP1, and the second bank pattern BNP2 having the lyophilic property and may be moved to the emission area EMA (or the hydrophobic area). For example, in a manufacturing process of the display device, the ink supplied to each pixel PXL may be prevented from spreading into an area (the hydrophobic area or the non-emission area NEMA) except for the hydrophilic area, and the ink may be induced to be positioned only in the hydrophilic area. Thus, the number of light emitting elements LD aligned in the emission area EMA of the corresponding pixel PXL may be increased to further secure the number of effective light sources forming the light emitting unit EMU of the corresponding pixel PXL. Accordingly, light output efficiency of each pixel PXL may be improved.

In addition, according to the above-described embodiment, a separate process (for example, a plasma surface treatment process or the like) for imparting liquid repellency to a bank may be omitted by forming the first bank BNK1 with the organic material having the liquid repellency in the non-emission area NEMA, thereby improving manufacturing process efficiency. Accordingly, a manufacturing cost of the display device may be reduced by manufacturing the display device by a simpler process.

Additionally, according to the above-described embodiment, an additional process for improving inter-layer characteristic variation may be omitted in case that an organic insulating layer is changed to an inorganic insulating layer or an inorganic insulating layer is changed to an organic insulating layer, by forming, as an organic insulating layer (or organic layer), insulating layers and/or insulating patterns (for example, the via layer VIA, the first insulating layer INS1, the first and second bank patterns BNP1, BNP2, and the first bank BNK1) included in the display element layer DPL (or positioned on the pixel circuit layer PCL) before the light emitting elements LD are aligned.

In addition, in the above-described embodiment, the via layer VIA, the first insulating layer INS1, and the first and second bank patterns BNP1 and BNP2 formed as the organic layer, and the first bank BNK1 formed as the organic layer may be connected to each other. Therefore, a process of forming a separate a path for outgas discharge may be omitted by discharging the outgas generated from the organic layer to the first bank BNK1.

FIGS. 15A to 15H are schematic cross-sectional views for illustrating a method of manufacturing the pixel PXL shown in FIG. 9.

Hereinafter, the pixel PXL according to the embodiment shown in FIG. 9 is sequentially described according to a manufacturing method with reference to FIGS. 15A to 15H.

In the embodiment, steps of manufacturing the pixel PXL are sequentially performed according to a cross-sectional view, but unless the spirit of the disclosure is changed, it is obvious that some steps shown as being performed consecutively may be performed simultaneously, an order of each step may be changed, some steps may be omitted, or another step may be further included between each step.

In FIGS. 15A to 15H, a point different from that of the above-described embodiment is mainly described in order to avoid a repetitive description.

Figure 15A:
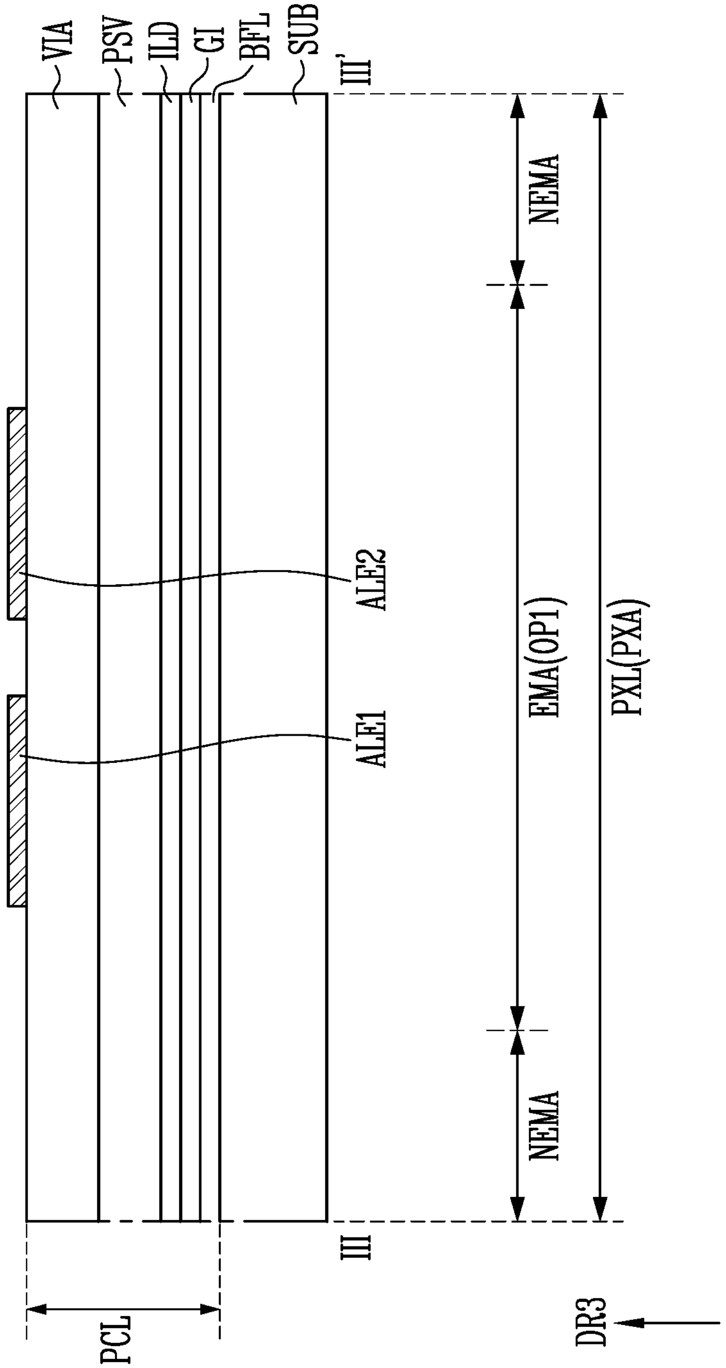
FIGS. 15A to 15H are cross-sectional views for schematically illustrating a method of manufacturing a pixel shown in FIG. 9.
Figure 15B:
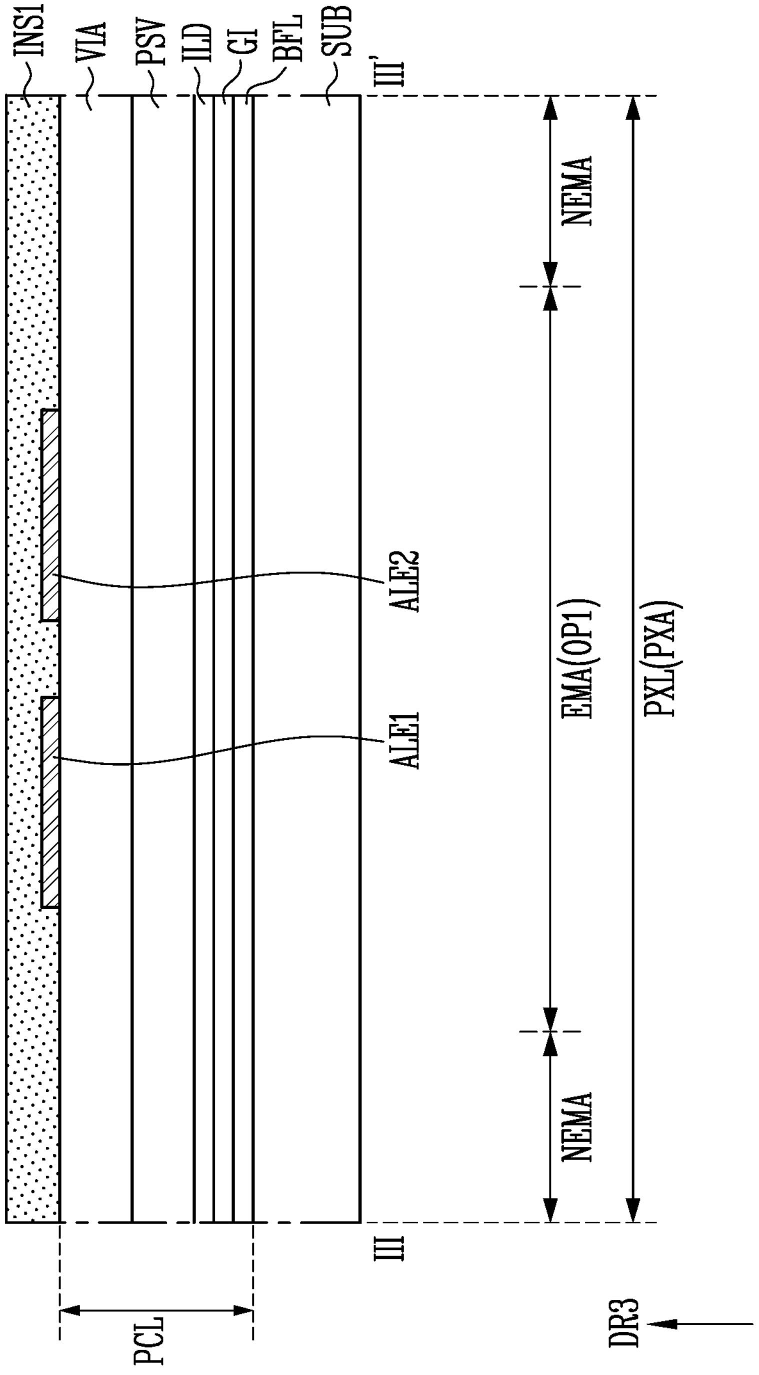
Figure 15C:
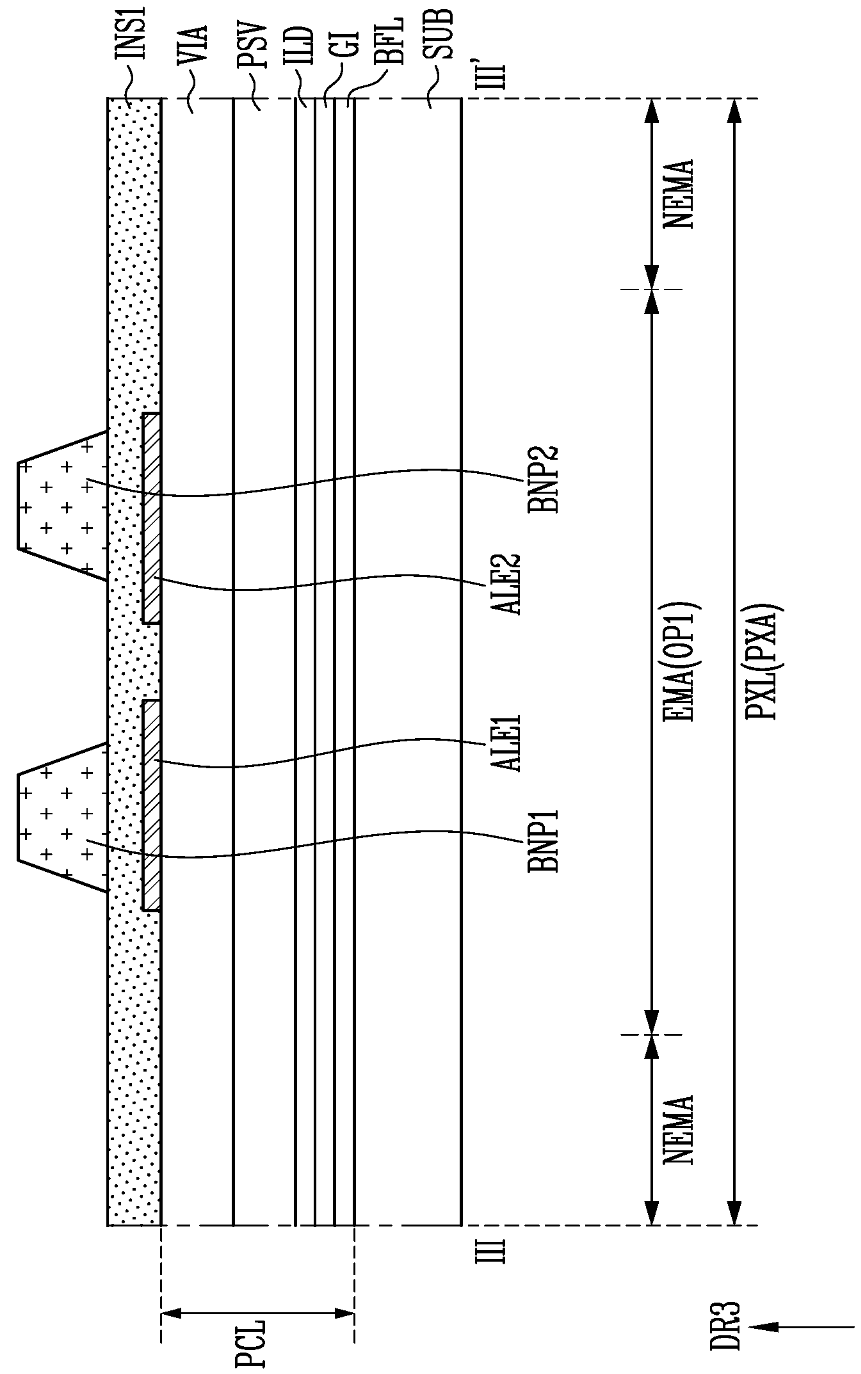
Figure 15D:
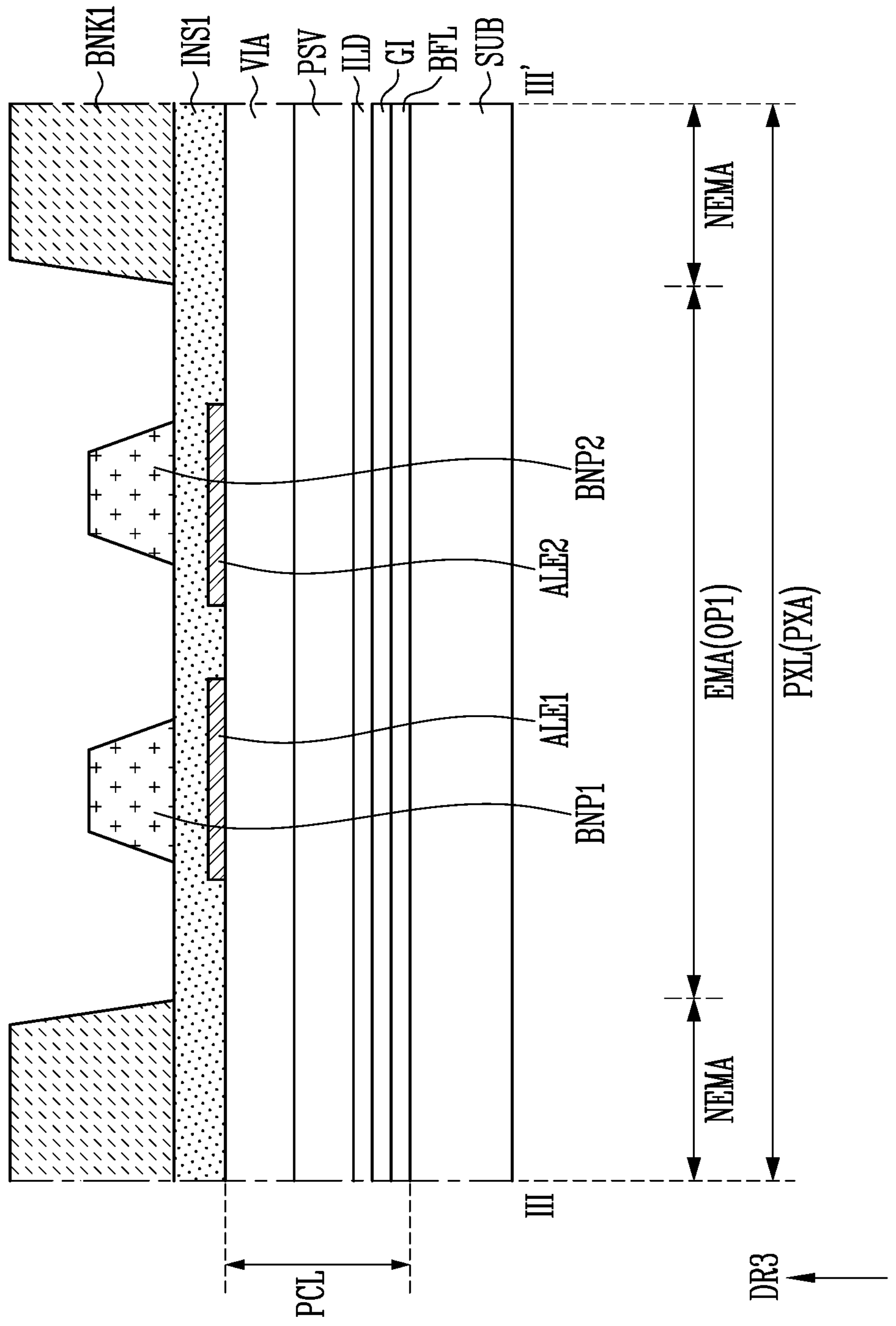
Figure 15E:
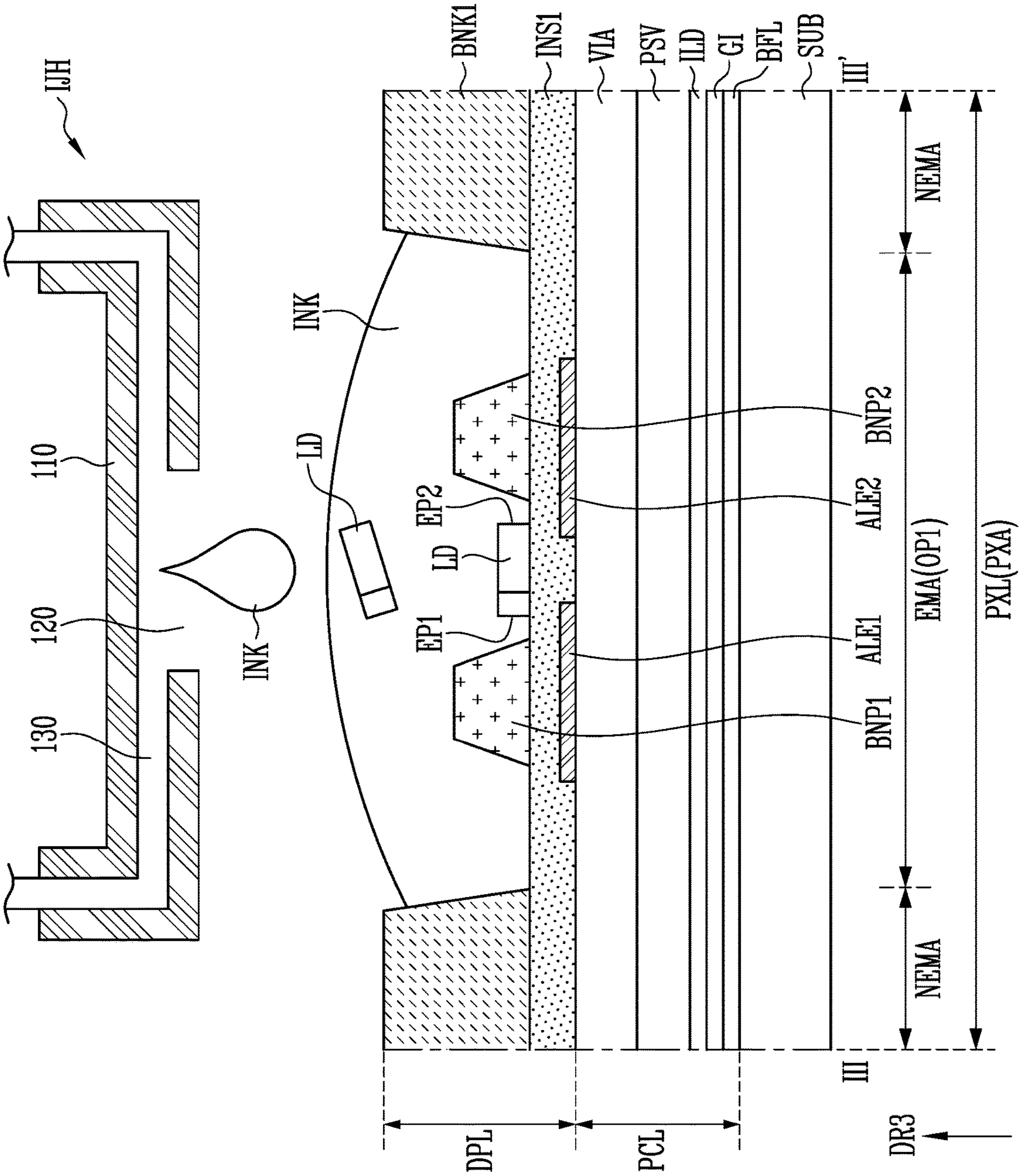
Figure 15F:
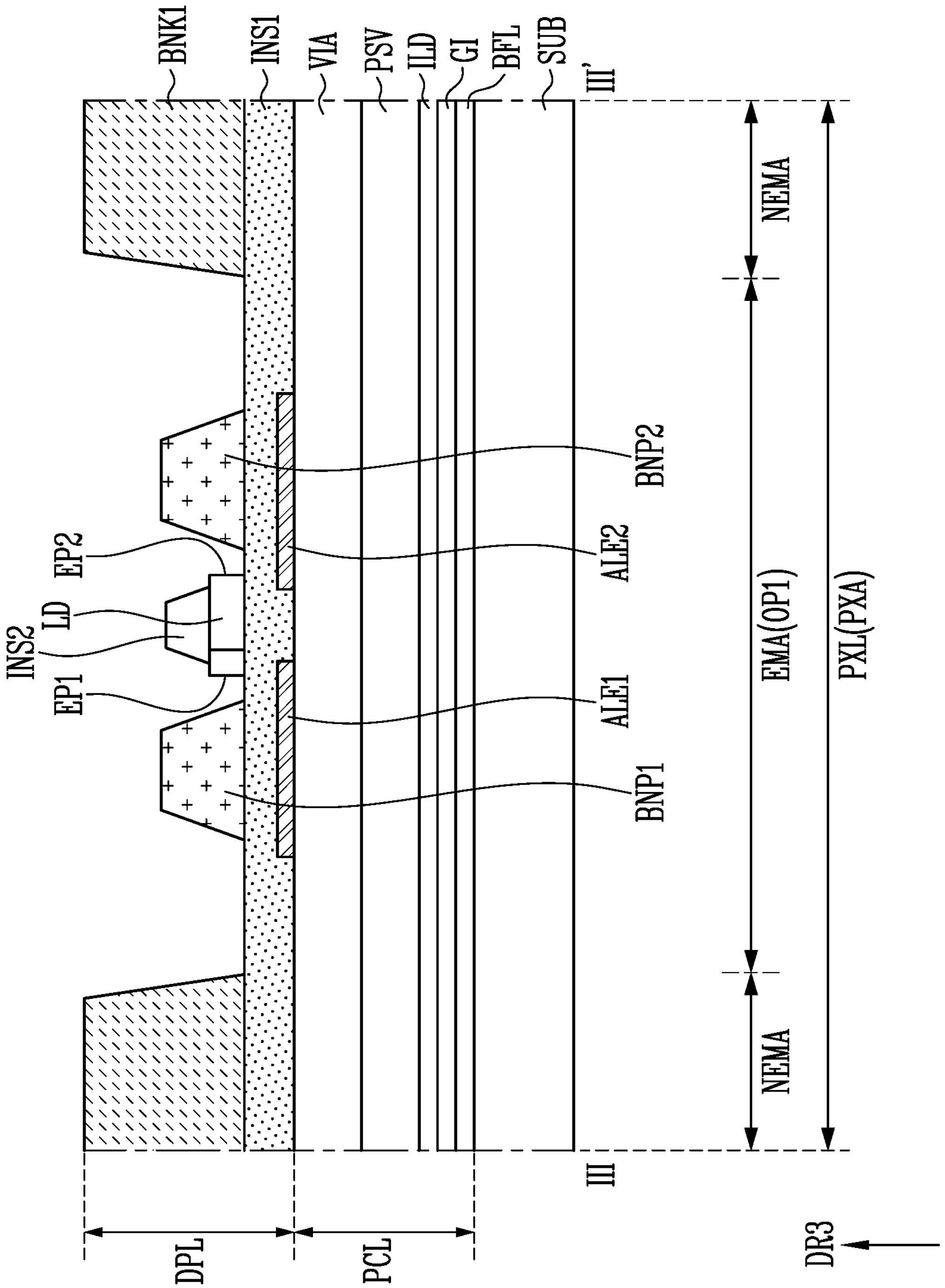
Figure 15G:
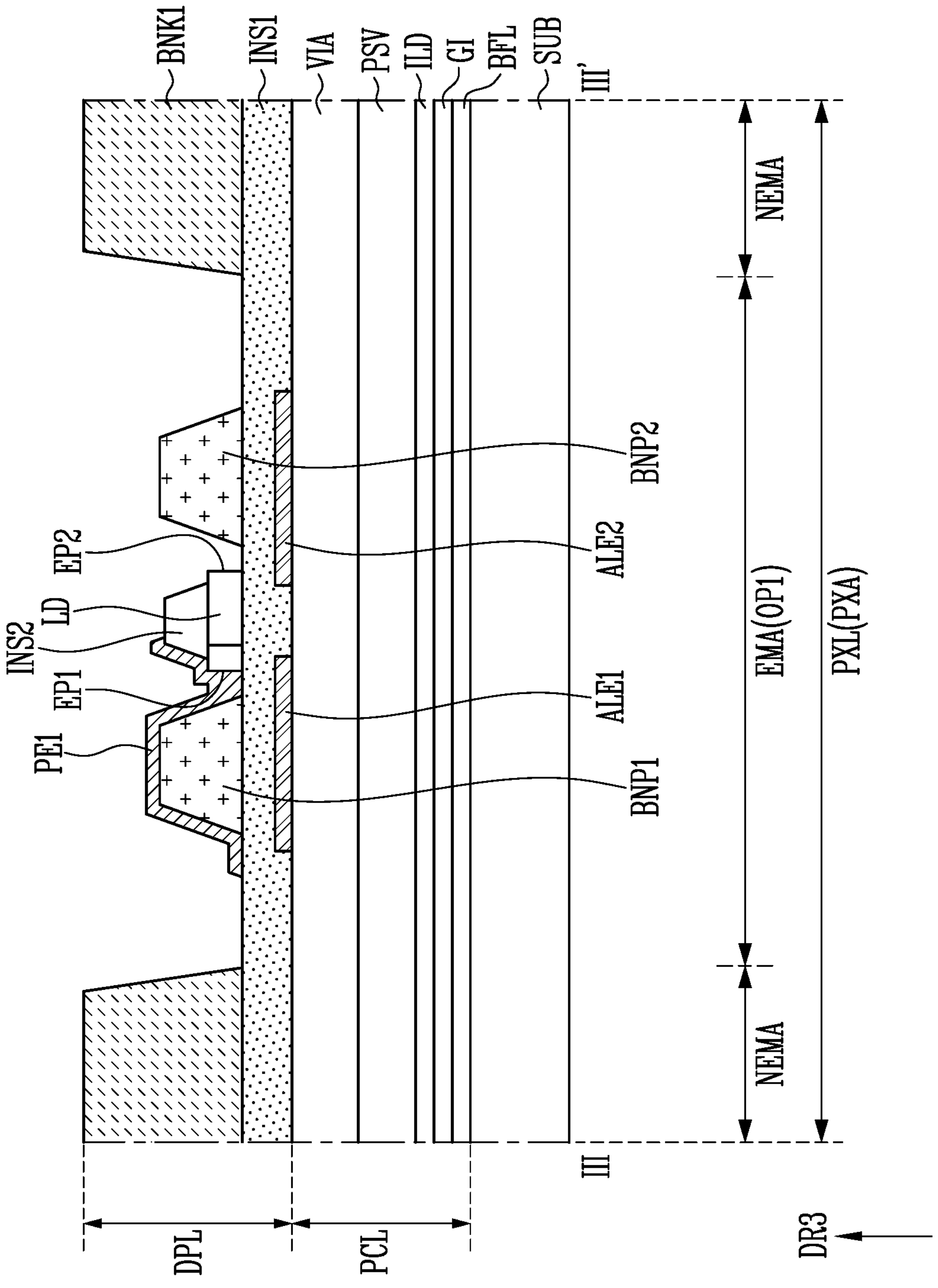
Figure 15H:
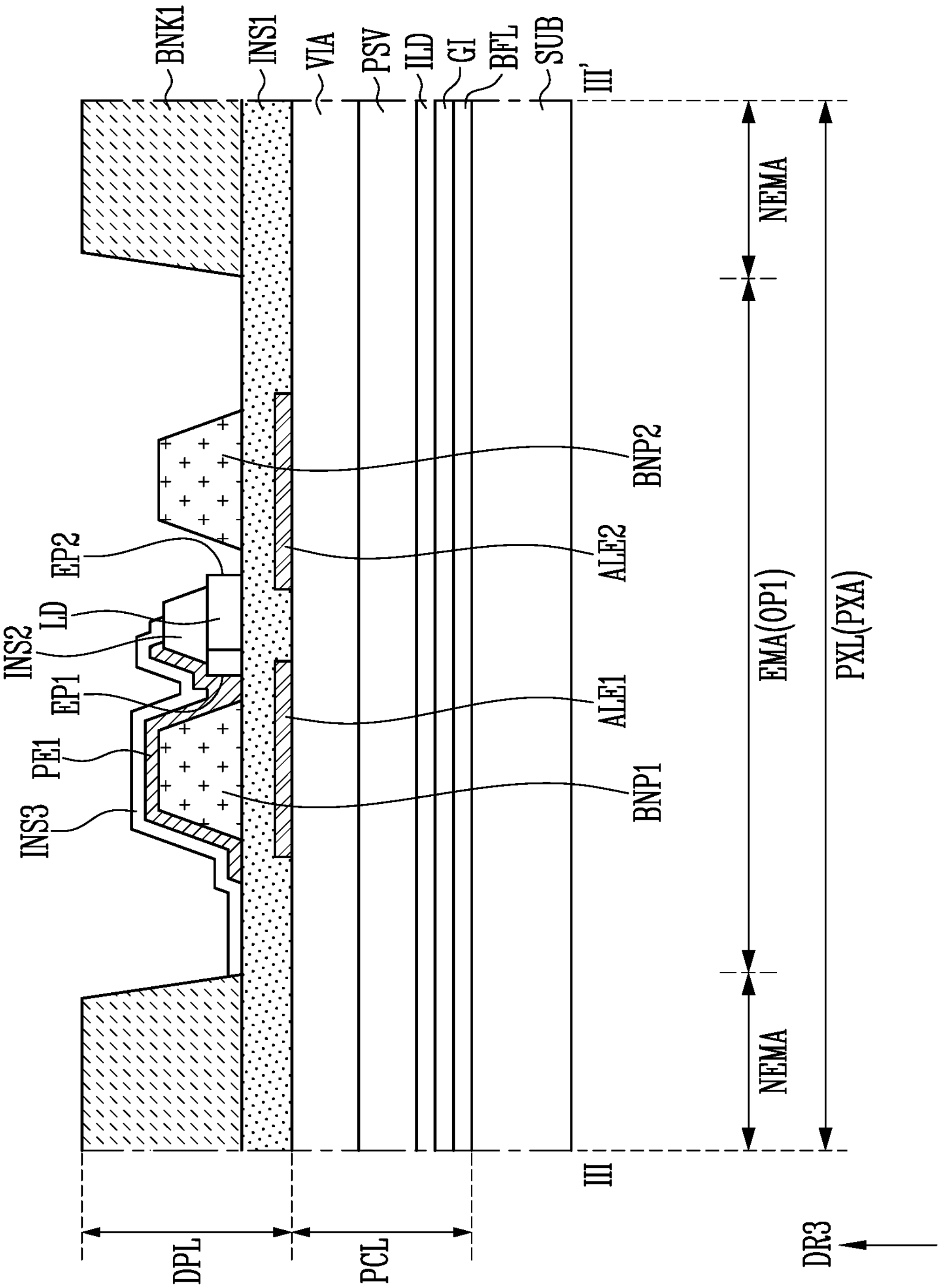

Referring to FIGS. 6, 9, and 15A, the pixel circuit layer PCL is formed on the substrate SUB. The pixel circuit layer PCL may include the buffer layer BFL, the gate insulating layer GI, the interlayer insulating layer ILD, the passivation layer PSV, and the via layer VIA. The via layer VIA may be the organic layer including the organic material.

The first alignment electrode ALE1 and the second alignment electrode ALE2 are formed on the via layer VIA.

Referring to FIGS. 6, 9, 15A, and 15B, the first insulating layer INS1 is formed on the via layer VIA. The first insulating layer INS1 may be formed as the organic layer including the organic material having the lyophilic property.

The first insulating layer INS1 may be partially opened to expose a portion of the first alignment electrode ALE1 and a portion of the second alignment electrode ALE2 in the non-emission area NEMA of each pixel PXL. For example, the first insulating layer INS1 may be partially opened to include the first contact portion CNT1 exposing a portion of the first alignment electrode ALE1 and the second contact portion CNT2 exposing a portion of the second alignment electrode ALE2 in the non-emission area NEMA.

Referring to FIGS. 6, 9, and 15A to 15C, the first bank pattern BNP1 and the second bank pattern BNP2 are formed in the emission area EMA of each pixel PXL. The first bank pattern BNP1 and the second bank pattern BNP2 may be disposed on a surface of the first insulating layer INS1 to be spaced apart from each other.

In one or more embodiments, the first bank pattern BNP1, the second bank pattern BNP2, and the first insulating layer INS1 may include a same material. For example, the first bank pattern BNP1 and the second bank pattern BNP2 may be formed as the organic layer including the organic material having the lyophilic property. According to one or more embodiments, the first bank pattern BNP1 and the second bank pattern BNP2 may be formed integrally with the first insulating layer INS1.

As the first insulating layer INS1 and the first and second bank patterns BNP1 and BNP2 having the lyophilic property are formed in the emission area EMA of each pixel PXL, the emission area EMA may become the hydrophilic area.

The via layer VIA, the first insulating layer INS1, and the first and second bank patterns BNP1 and BNP2 may be connected to each other.

Referring to FIGS. 6, 9, and 15A to 15D, the first bank BNK1 is formed in each pixel PXL. The first bank BNK1 may be formed as the organic layer including the organic material having the liquid repellency. As the first bank BNK1 having the liquid repellency is formed in the non-emission area NEMA of each pixel PXL, the non-emission area NEMA may become the hydrophobic area.

Referring to FIGS. 6, 9, and 15A to 15E, an electric field is formed between the first alignment electrode ALE1 and the second alignment electrode ALE2 by applying an alignment signal corresponding to each of the first alignment electrode ALE1 and the second alignment electrode ALE2.

The light emitting elements LD are aligned between the first alignment electrode ALE1 and the second alignment electrode ALE2. The light emitting elements LD are supplied (or input) to the pixel area PXA by the inkjet printing method. For example, an inkjet head part IJH may be disposed so that a nozzle 120 is properly positioned on the first insulating layer INS1 between the first bank pattern BNP1 and the second bank pattern BNP2.

The inkjet head part IJH may include a print head 110 and at least one nozzle 120 positioned on a lower surface of the print head 110. The print head 110 may have a shape extending in a direction, but the disclosure is not limited thereto. The print head 110 may include an inner tube 130 formed in an extension direction. The nozzle 120 may be connected to the inner tube 130 of the print head 110. An ink INK including a solvent and light emitting elements LD included (or dispersed) in the solvent may be supplied to the inner tube 130, and the ink INK may flow along the inner tube 130 and may be sprayed (or discharged) at a preset position through the nozzle 120. The ink INK sprayed through the nozzle 120 may be supplied to the first insulating layer INS1 of the pixel PXL. An amount of the ink INK sprayed through the nozzle 120 may be adjusted according to a signal applied to the corresponding nozzle 120. A method of inputting the light emitting elements LD into the pixel area PXA is not limited to the above-described embodiment, and the method of inputting the light emitting elements LD may be variously changed.

In case that the light emitting elements LD are input into the pixel area PXA, the ink INK including the light emitting elements LD may be applied only to the emission area EMA having hydrophilicity. In one or more embodiments, as the first bank pattern BNP1 and the second bank pattern BNP2 having the lyophilic property are formed on the first insulating layer INS1 having the lyophilic property, the lyophilic property may be further imparted to an area of the emission area EMA surrounded by the first bank pattern BNP1, the second bank pattern BNP2, and the first insulating layer INS1. Accordingly, the number of light emitting elements LD aligned in the emission area EMA may be increased by guiding the ink INK to be positioned only in the one area.

Self-alignment of the light emitting elements LD may be induced on the first insulating layer INS1 having a flat surface between the first bank pattern BNP1 and the second bank pattern BNP2.

After the light emitting elements LD are self-aligned, the solvent included in the ink may be evaporated or removed by other methods.

Referring to FIGS. 6, 9, and 15A to 15F, after the light emitting elements LD are aligned in the pixel area PXA (or the emission area EMA), the second insulating layer INS2 is formed on the light emitting elements LD. The second insulating layer INS2 may cover at least a portion of a surface (for example, an upper surface in the third direction DR3) of each of the light emitting elements LD to expose the first and second ends EP1 and EP2 to the outside except for the active layer 12 (refer to FIG. 1) of each of the light emitting elements LD. The second insulating layer INS2 may prevent the light emitting elements LD from being separated from the aligned positions by fixing the light emitting elements LD.

In case that a process of forming the second insulating layer INS2 is performed, a portion of the first alignment electrode ALE1 may be removed from the second opening OP2 of the first bank BNK1, which is the electrode separation area, so that the pixel PXL may be driven independently or separately from the pixels PXL adjacent thereto. Accordingly, the first alignment electrode ALE1 may be electrically and/or physically separated from the first alignment electrode ALE1 provided to the adjacent pixels PXL positioned in a same pixel column. According to one or more embodiments, in the above-described process, a portion of the second alignment electrode ALE2 may also be removed from the second opening OP2 of the first bank BNK1 to be electrically and/or physically separated from the second alignment electrode ALE2 provided to the adjacent pixels PXL.

Referring to FIGS. 6, 9, and 15A to 15G, the first pixel electrode PE1 is formed on the second insulating layer INS2, the first end EP1 of each of the light emitting elements LD, the first bank pattern BNP1, and the first insulating layer INS1.

The first pixel electrode PE1 may be electrically and/or physically connected to the first alignment electrode ALE1 through the first contact hole CH1 of the first insulating layer INS1 in the non-emission area NEMA.

Referring to FIGS. 6, 9, and 15A to 15H, the third insulating layer INS3 is formed on the first pixel electrode PE1. In one or more embodiments, the third insulating layer INS3 may be formed as the inorganic insulating layer including the inorganic material. The third insulating layer INS3 may cover the first pixel electrode PE1 while exposing a portion of the second end EP2 of each of the light emitting elements LD, the second bank pattern BNP2, and the first insulating layer INS1.

The second pixel electrode PE2 may be formed on the third insulating layer INS3. The second pixel electrode PE2 may be positioned on the third insulating layer INS3, the second insulating layer INS2, the second end EP2 of each of the light emitting elements LD, the second bank pattern BNP2, and the first insulating layer INS1.

The second pixel electrode PE2 may be electrically and/or physically connected to the second alignment electrode ALE2 through the second contact hole CH2 of the first insulating layer INS1 in the non-emission area NEMA.

Figure 16:
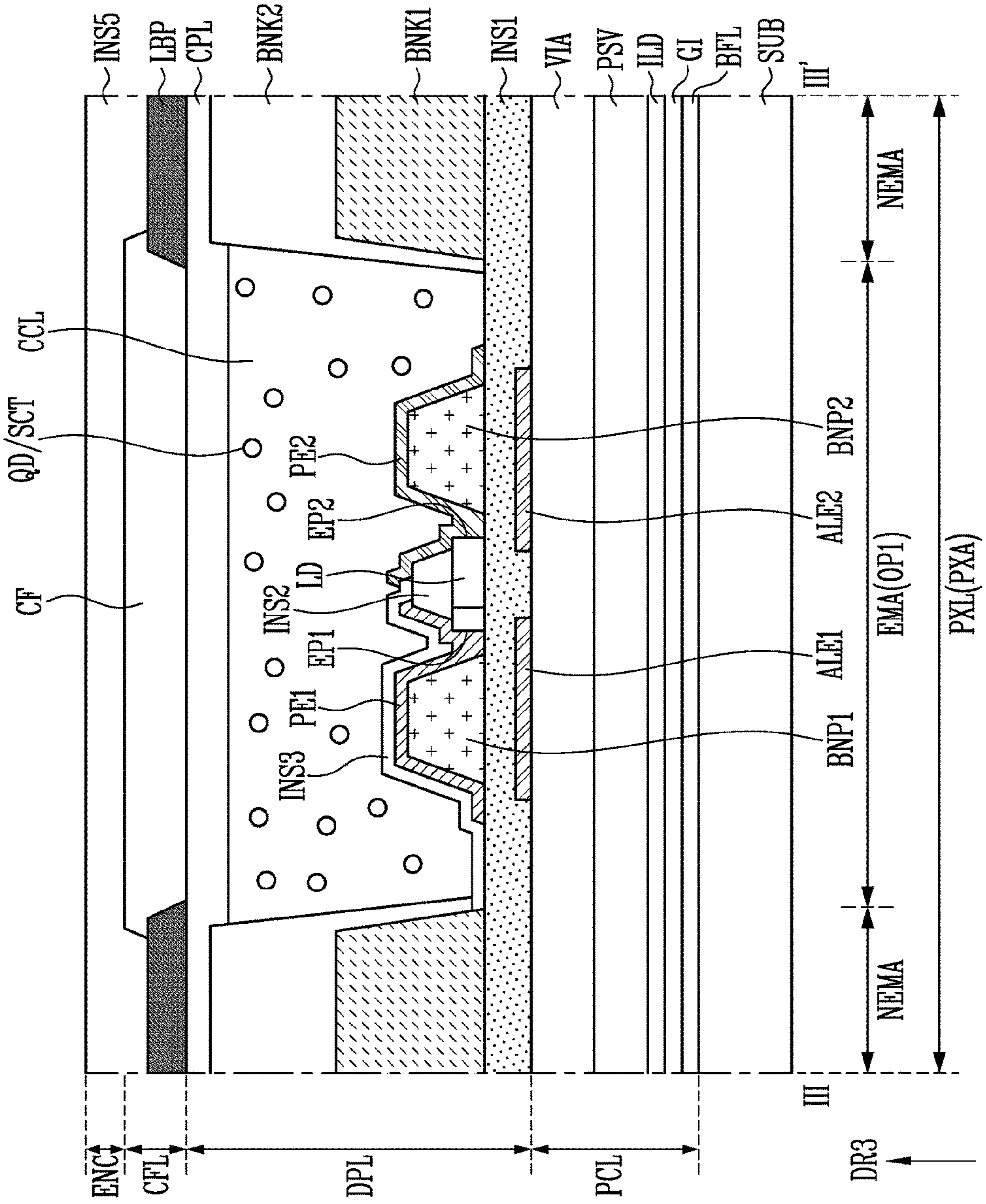
FIGS. 16 and 17 schematically illustrate a pixel according to one or more embodiments, and are schematic cross-sectional views corresponding to line III-III' of FIG. 6.
Figure 17:
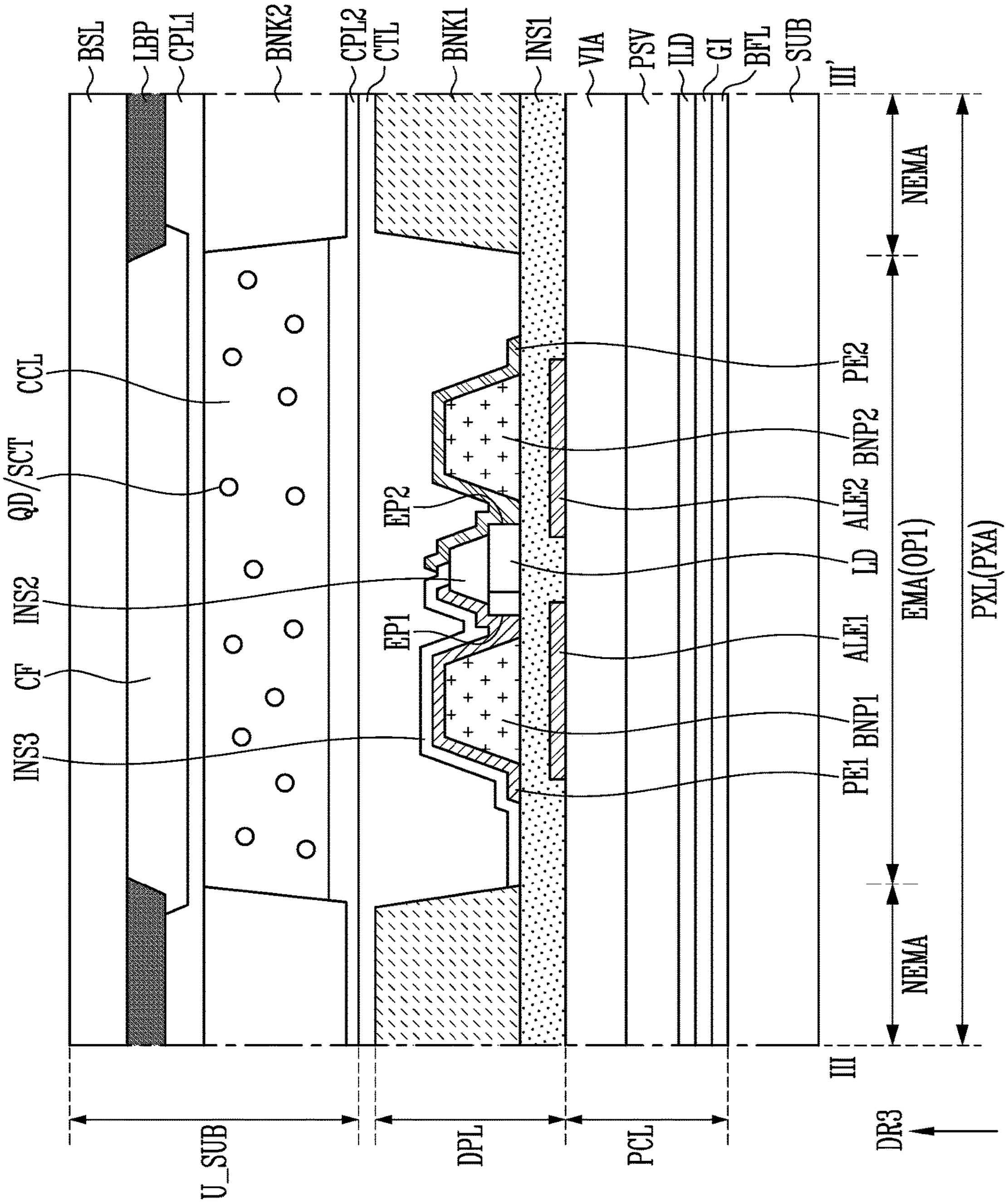

FIGS. 16 and 17 schematically illustrate a pixel PXL according to one or more embodiments, and are schematic cross-sectional views corresponding to line III-III' of FIG. 6.

FIGS. 16 and 17 illustrate a modified example of FIG. 14 in relation to a position of a color conversion layer CCL. For example, FIG. 16 illustrates one or more embodiments in which the color conversion layer CCL is positioned on the display element layer DPL by a successive process, and FIG. 17 illustrates one or more embodiments in which an upper substrate U_SUB including the color conversion layer CCL is positioned on the display element layer DPL by an adhesion process using an intermediate layer CTL.

In relation to the embodiments of FIGS. 16 and 17, a point different from that of the above-described embodiment is mainly described in order to avoid a repetitive description.

Referring to FIGS. 1 to 17, the display element layer DPL of each pixel PXL may further include the color conversion layer CCL positioned in the emission area EMA and a second bank BNK2 positioned in the non-emission area NEMA.

The second bank BNK2 may be provided and/or formed on the first bank BNK1 in the non-emission area NEMA of the pixel PXL. The second bank BNK2 may be a structure that surrounds the emission area EMA and finally defines the emission area EMA by defining a position to which the color conversion layer CCL is to be supplied. For example, the second bank BNK2 may be a structure that finally defines the emission area EMA of the corresponding pixel PXL by defining a position to which the color conversion layer CCL is supplied (or fed) to each pixel PXL.

The second bank BNK2 may include a light blocking material. For example, the second bank BNK2 may be a black matrix. According to one or more embodiments, the second bank BNK2 may be configured to include at least one light blocking material and/or a reflective material to allow light, emitted from the color conversion layer CCL, to further proceed in the image display direction (or the third direction DR3, thereby improving light output efficiency of the color conversion layer CCL. According to one or more embodiments, the second bank BNK2 and the first bank BNK1 may include a same material. For example, the second bank BNK2 may be an organic layer including a liquid repellent organic material. The second bank BNK2 may be an organic layer including a fluorine-based liquid repellent agent. As the second bank BNK2 having liquid repellency is positioned on the first bank BNK1, the non-emission area NEMA may be partitioned into a hydrophobic area.

The color conversion layer CCL may be formed on the first pixel electrode PE1 and the second pixel electrode PE2 in the emission area EMA surrounded by the second bank BNK2.

The color conversion layer CCL may include color conversion particles QD corresponding to a specific color. For example, the color conversion layer CCL may include the color conversion particles QD that convert light of a first color, emitted from the light emitting elements LD, into light of a second color (or the specific color).

In case that the pixel PXL is a red pixel (or a red sub-pixel), the color conversion layer CCL may include color conversion particles QD of a red quantum dot that converts the light of the first color, emitted from the light emitting elements LD, into the light of the second color, for example, light of a red color.

In case that the pixel PXL is a green pixel (or a green sub-pixel), the color conversion layer CCL may include color conversion particles QD of a green quantum dot that converts the light of the first color, emitted from the light emitting elements LD, into the light of the second color, for example, light of a green color.

In case that the pixel PXL is a blue pixel (or a blue sub-pixel), the color conversion layer CCL may include color conversion particles QD of a blue quantum dot that converts the light of the first color, emitted from the light emitting elements LD, into the light of the second color, for example, light of a blue color. According to one or more embodiments, in case that the pixel PXL is the blue pixel (or the blue sub-pixel), a light scattering layer including light scattering particles SCT may be provided instead of the color conversion layer CCL including the color conversion particles QD. For example, in case that the light emitting elements LD emit blue-based light, the pixel PXL may include the light scattering layer including the light scattering particles SCT. The above-described light scattering layer may be omitted according to one or more embodiments. According to an embodiment, in case that the pixel PXL is the blue pixel (or the blue sub-pixel), a transparent polymer may be provided instead of the color conversion layer CCL.

As the second bank BNK2 having the liquid repellency is positioned on the first bank BNK1 of the non-emission area NEMA, the ink including the color conversion particles QD may be prevented from being spread to the area (the hydrophobic area or the non-emission area NEMA) except for the hydrophilic area and may guide the ink so that the ink is positioned only in the emission area EMA which is the hydrophilic area. The ink may be positioned in the emission area EMA and cured to become the color conversion layer CCL.

The display element layer DPL may include a capping layer CPL disposed on the color conversion layer CCL and the second bank BNK2.

The capping layer CPL may be entirely (or completely) provided in the pixel area PXA of the pixel PXL to cover the second bank BNK2 and the color conversion layer CCL. The capping layer CPL may be directly disposed on the second bank BNK2 and the color conversion layer CCL. The capping layer CPL may be an inorganic insulating layer including an inorganic material. The capping layer CPL may include at least one of a metal oxide such as silicon nitride ($SiN_x$), silicon oxide ($SiO_x$), silicon oxynitride ($SiO_xN_y$), and aluminum oxide ($AlO_x$). The capping layer CPL may completely cover the second bank BNK2 and the color conversion layer CCL to prevent water, moisture, or the like from flowing into the display element layer DPL from the outside.

The capping layer CPL may have a surface which is flat and alleviating a step difference (or height difference) generated by components disposed thereunder. For example, the capping layer CPL may include an organic insulating layer including an organic material. The capping layer CPL may be a common layer commonly provided to the display area DA, but is not limited thereto.

A color filter layer CFL may be provided and/or formed on the capping layer CPL.

In the embodiment of FIG. 16, the color filter layer CFL may include a color filter CF corresponding to a color of each pixel PXL and a light blocking pattern LBP adjacent to the color filter CF.

The color filter CF may include a color filter material that selectively transmits light of the specific color converted by the color conversion layer CCL. The color filter CF may include a red color filter, a green color filter, and a blue color filter. The above-described color filter CF may be provided on a surface of the capping layer CPL to correspond to the color conversion layer CCL.

The light blocking pattern LBP may be disposed on a surface of the capping layer CPL to be adjacent to the color filter CF. For example, the light blocking pattern LBP may be positioned on a surface of the capping layer CPL to correspond to the non-emission area NEMA. The light blocking pattern LBP may correspond to the second bank BNK2. The light blocking pattern LBP may include a light blocking material that prevents a light leakage defect in which light (or rays) is leaked between the pixel PXL and the pixels PXL adjacent thereto. For example, the light blocking pattern LBP may include a black matrix. The light blocking pattern LBP may prevent color mixing of light emitted from each of the adjacent pixels PXL.

The light blocking pattern LBP may be provided in a form of multiple layers (or multiple films) in which at least two or more color filters that selectively transmit light of different colors are overlapped. For example, the light blocking pattern LBP may include a first color filter positioned on the capping layer CPL of the non-emission area NEMA, a second color filter positioned on the first color filter and overlapping the first color filter, and a third color filter positioned on the second color filter and overlapping the second color filter. In this case, in the non-emission area NEMA of the pixel area PXA, the first color filter, the second color filter, and the third color filter may be used as the light blocking pattern LBP that blocks transmission of light.

An encapsulation layer ENC may be provided and/or formed on the color filter layer CFL.

The encapsulation layer ENC may include a fifth insulating layer INS5. The fifth insulating layer INS5 may be an inorganic insulating layer including an inorganic material or an organic insulating layer including an organic material. The fifth insulating layer INS5 may entirely cover configurations positioned thereunder, and may block water, moisture, or the like from flowing into the color filter layer CFL and the display element layer DPL from the outside.

In the display device ("each sub-pixel" or "each pixel PXL") according to the above-described embodiment, the color conversion layer CCL and the color filter CF may be disposed on the light emitting element LD. Therefore, light having excellent color reproducibility may be emitted through the color conversion layer CCL and the color filter CF, and thus light output efficiency may be improved.

In one or more embodiments, the fifth insulating layer INS5 may be formed as multiple layers. For example, the fifth insulating layer INS5 may include at least two inorganic insulating layers and at least one organic insulating layer interposed between the at least two inorganic insulating layers. However, a material and/or a structure of the fifth insulating layer INS5 may be variously changed. In addition, according to one or more embodiments, at least one overcoat layer, a filler layer, an upper substrate, and/or the like may be further disposed on the fifth insulating layer INS5.

In the above-described embodiment, the color conversion layer CCL is directly formed on the first pixel electrode PE1 and the second pixel electrode PE2, but the disclosure is not limited thereto. According to one or more embodiments, as shown in FIG. 17, the color conversion layer CCL may be formed on a separate substrate, for example, the upper substrate U_SUB, and may be combined with the display element layer DPL including the first pixel electrode PE1 and the second pixel electrode PE2 through the intermediate layer CTL.

The intermediate layer CTL may be a transparent adhesive layer for strengthening adhesive force between the display element layer DPL and the upper substrate U_SUB, for example, an optically clear adhesive, but is not limited. According to one or more embodiments, the intermediate layer CTL may be a refractive index conversion layer for improving an emission luminance of the pixel PXL by converting a refractive index of light emitted from the light emitting elements LD and proceeding to the upper substrate U_SUB. According to one or more embodiments, the intermediate layer CTL may include a filler formed of an insulating material having an insulating property and an adhesive property.

The upper substrate U_SUB may form an encapsulation substrate and/or a window member of the display device. The upper substrate U_SUB may include a base layer BSL (or a base substrate), the color conversion layer CCL, the second bank BNK2, the color filter CF, the light blocking pattern LBP, and first and second capping layers CPL1 and CPL2.

The base layer BSL may be a rigid substrate or a flexible substrate, and a material or a property thereof is not particularly limited. The base layer BSL and the substrate SUB may be formed of a same material or may be formed of different materials.

In FIG. 17, the color conversion layer CCL may be disposed on a surface of the first capping layer CPL1 to face the display element layer DPL. The color filter CF may be provided on a surface of the base layer BSL to correspond to the color conversion layer CCL.

The first capping layer CPL1 may be provided and/or formed between the color filter CF and the color conversion layer CCL.

The first capping layer CPL1 may be disposed on the color filter CF to cover the color filter CF, thereby protecting the color filter CF. The first capping layer CPL1 may be an inorganic layer including an inorganic material or an organic layer including an organic material.

The light blocking pattern LBP may be positioned adjacent to the color filter CF. The light blocking pattern LBP may be disposed on a surface of the base layer BSL to correspond to the non-emission area NEMA of each pixel PXL.

The light blocking pattern LBP may be positioned on a surface of the base layer BSL and may be positioned adjacent to the color filter CF. The first capping layer CPL1 may be provided and/or formed on the light blocking pattern LBP.

The color conversion layer CCL and the second bank BNK2 may be disposed on a surface of the first capping layer CPL1. The second bank BNK2 may be a structure that finally defines the emission area EMA of each pixel PXL, and may be formed as an organic layer including an organic material having liquid repellency. The second bank BNK2 may be a dam structure that finally defines a first emission area EMA1 to which the color conversion layer CCL is to be supplied in a step of supplying the color conversion layer CCL.

The second capping layer CPL2 may be entirely provided and/or formed on the color conversion layer CCL and the second bank BNK2.

The second capping layer CPL2 may include at least one of a metal oxide such as silicon nitride ($SiN_x$), silicon oxide ($SiO_x$), silicon oxynitride ($SiO_xN_y$), and aluminum oxide ($AlO_x$), but is not limited thereto. According to one or more embodiments, the second capping layer CPL2 may be formed as an organic layer including an organic material. The second capping layer CPL2 may be disposed on the color conversion layer CCL to protect the color conversion layer CCL from external water, moisture, and the like, thereby further improving reliability of the color conversion layer CCL.

The above-described upper substrate U_SUB may be combined with the display element layer DPL by using the intermediate layer CTL.

Figure 18:
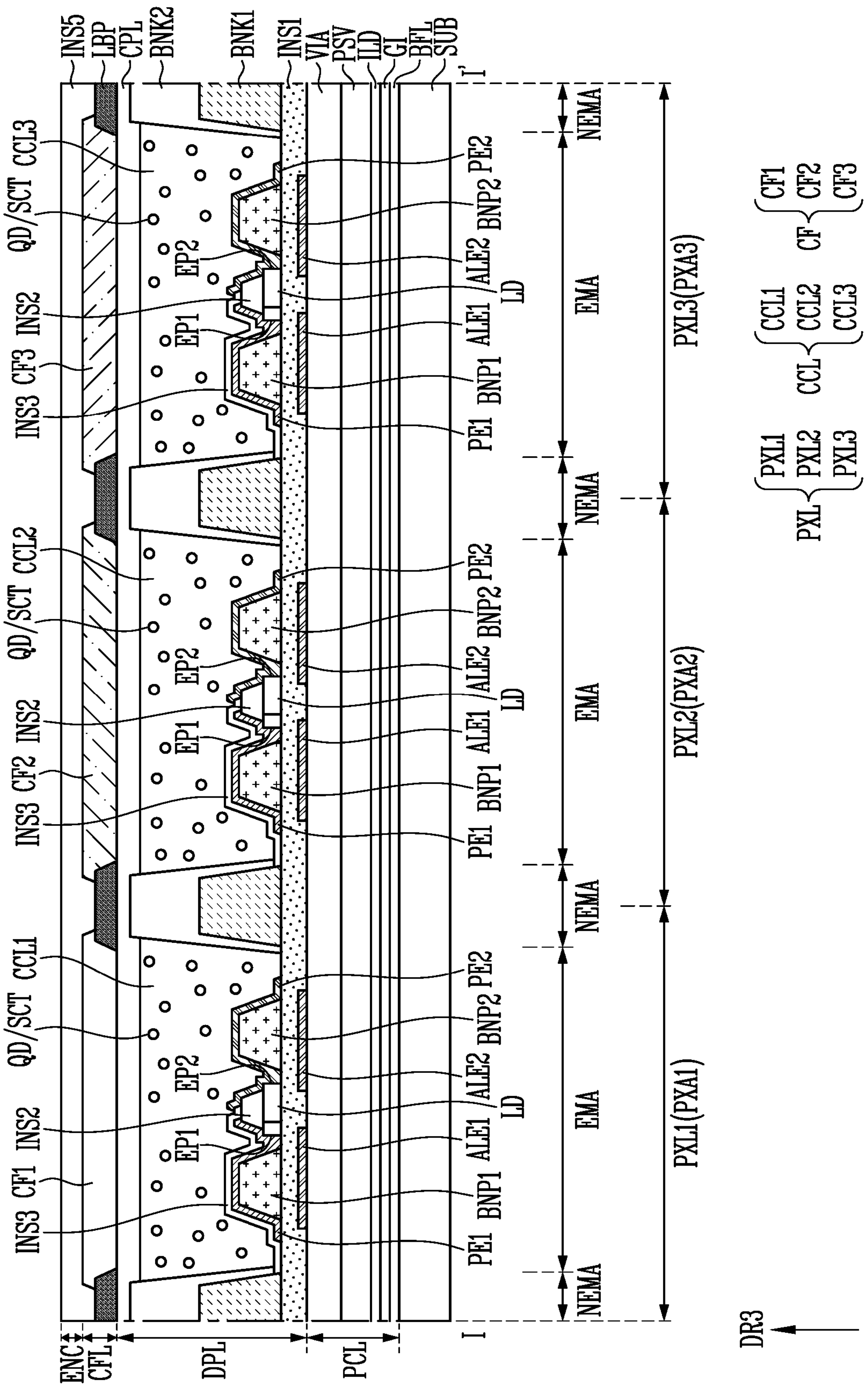
FIG. 18 is a schematic cross-sectional view taken along line I-I' of FIG. 3.

FIG. 18 is a schematic cross-sectional view taken along line I-I' of FIG. 3.

In order to avoid a repetitive description in relation to first to third pixels PXL1 to PXL3 of FIG. 18, a point different from that of the above-described embodiment is mainly described. A part that is not specially described in the embodiment is in accordance with the above-described embodiment, the same reference numeral denotes the same component, and a similar reference numeral denotes a similar component.

FIG. 18 illustrates only a partial configuration of each of the first to third pixels PXL1 to PXL3 for convenience.

Referring to FIGS. 3 and 18, the first pixel PXL1 (or a first sub-pixel), the second pixel PXL2 (or a second sub-pixel), and the third pixel PXL3 (or a third sub-pixel) may be arranged in a direction. Each of the first to third pixels PXL1, PXL2, and PXL3 and the pixel PXL described with reference to FIGS. 6 to 14 may have a same configuration.

The display area DA of the substrate SUB may include a first pixel area PXA1 in which the first pixel PXL1 is provided (or arranged), a second pixel area PXA2 in which the second pixel PXL2 is provided (or arranged), and a third pixel area PXA3 in which the third pixel PXL3 is provided (or arranged). In one or more embodiments, the first pixel PXL1 may be a red pixel, the second pixel PXL2 may be a green pixel, and the third pixel PXL3 may be a blue pixel. However, the disclosure is not limited thereto, and according to one or more embodiments, the second pixel PXL2 may be a red pixel, the first pixel PXL1 may be a green pixel, and the third pixel PXL3 may be a blue pixel. In addition, according to an embodiment, the third pixel PXL3 may be a red pixel, the first pixel PXL1 may be a green pixel, and the second pixel PXL2 may be a blue pixel.

Each of the first, second, and third pixels PXL1, PXL2, and PXL3 may include the emission area EMA. In addition, each of the first, second, and third pixels PXL1, PXL2, and PXL3 may include the non-emission area NEMA adjacent to the emission area EMA of the corresponding pixel PXL. The first bank BNK1 may be positioned in the non-emission area NEMA.

Each of the first, second, and third pixels PXL1, PXL2, and PXL3 may include the substrate SUB, the pixel circuit layer PCL, and the display element layer DPL.

The display element layer DPL of each of the first, second, and third pixels PXL1, PXL2, and PXL3 may include the first and second alignment electrodes ALE1 and ALE2, the first insulating layer INS1, the first and second bank patterns BNP1 and BNP2, the first and second banks BNK1 and BNK2, the second insulating layer INS2, at least one light emitting element LD, the third insulating layer INS3, the first and second pixel electrodes PE1 and PE2, the color conversion layer CCL, and the capping layer CPL. The color conversion layer CCL may include a first color conversion layer CCL1, a second color conversion layer CCL2, and a third color conversion layer CCL3. The first color conversion layer CCL1 may be positioned on the first and second pixel electrodes PE1 and PE2 of the first pixel PXL1, the second color conversion layer CCL2 may be positioned on the first and second pixel electrodes PE1 and PE2 of the second pixel PXL2, and the third color conversion layer CCL3 may be positioned on the first and second pixel electrodes PE1 and PE2 of the third pixel PXL3.

The color filter layer CFL and the encapsulation layer ENC may be disposed on the display element layer DPL of each of the first, second, and third pixels PXL1, PXL2, and PXL3. The color filter layer CFL may include a first color filter CF1, a second color filter CF2, a third color filter CF3, and the light blocking pattern LBP. The first color filter CF1 may be positioned on a surface of the capping layer CPL to correspond to the first color conversion layer CCL1, the second color filter CF2 may be positioned on a surface of the capping layer CPL to correspond to the second color conversion layer CCL2, and the third color filter CF3 may be positioned on a surface of the capping layer CPL to correspond to the third color conversion layer CCL3.

Before the light emitting element LD is aligned in the first pixel area PXA1 in which the first pixel PXL1 is disposed, the first insulating layer INS1 and the first and second bank patterns BNP1 and BNP2 having the lyophilic property are positioned in the emission area EMA, and the first bank BNK1 having the liquid repellency is positioned in the non-emission area NEMA. Accordingly, the first pixel area PXA1 may be divided into the emission area EMA having hydrophilicity and the non-emission area NEMA having hydrophobicity.

Before the light emitting element LD is aligned in the second pixel area PXA2 in which the second pixel PXL2 is disposed, the first insulating layer INS1 and the first and second bank patterns BNP1 and BNP2 having the lyophilic property are positioned in the emission area EMA, and the first bank BNK1 having the liquid repellency is positioned in the non-emission area NEMA. Accordingly, the second pixel area PXA2 may be divided into the emission area EMA having hydrophilicity and the non-emission area NEMA having hydrophobicity.

Before the light emitting element LD is aligned in the third pixel area PXA3 in which the third pixel PXL3 is disposed, the first insulating layer INS1 and the first and second bank patterns BNP1 and BNP2 having the lyophilic property are positioned in the emission area EMA, and the first bank BNK1 having the liquid repellency is positioned in the non-emission area NEMA. Accordingly, the third pixel area PXA3 may be divided into the emission area EMA having hydrophilicity and the non-emission area NEMA having hydrophobicity.

In the above-described embodiment, the pixel area of each of the first, second, and third pixels PXL1, PXL2, and PXL3 may be divided into the emission area EMA having hydrophilicity and the non-emission area NEMA having hydrophobicity according to a material property of the first insulating layer INS1, the first bank pattern BNP1, the second bank pattern BNP2, and the first bank BNK1. Accordingly, in case that the light emitting element LD is supplied to each of the first, second, and third pixels PXL1, PXL2, and PXL3, the light emitting element LD may be aligned only in the hydrophilic area of the corresponding pixel PXL. Accordingly, an abnormal alignment defect in which the light emitting element LD is aligned in an unwanted area may be prevented.

In addition, in the above-described embodiment, a liquid repellency process for providing the liquid repellency to the bank may be omitted by forming the first bank BNK1 having the liquid repellency in the non-emission area NEMA of the corresponding pixel PXL, thereby improving manufacturing process efficiency of the display device.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:

a substrate; and a plurality of pixels disposed on the substrate and including an emission area and a non-emission area, the plurality of pixels comprising:

a via layer disposed on the substrate and including an organic layer;

a first alignment electrode and a second alignment electrode disposed on the via layer in the emission area and spaced apart from each other;

a first insulating layer disposed on the first and second alignment electrodes of the emission area and including a lyophilic organic material;

a first bank pattern and a second bank pattern disposed on the first insulating layer of the emission area and spaced apart from each other;

a first bank disposed in the non-emission area, including an opening corresponding to the emission area, and including a liquid repellent organic material; and a light-emitting element disposed on the first insulating layer between the first bank pattern and the second bank pattern in the emission area.

2. The display device according to claim 1, wherein the first bank pattern and the second bank pattern include the lyophilic organic material.

3. The display device according to claim 2, wherein the first insulating layer, the first bank pattern, and the second bank pattern are integral with each other.

4. The display device according to claim 2, wherein the liquid repellent organic material includes an acrylic polymer including a liquid repellent agent and a radical initiator.

5. The display device according to claim 4, wherein the liquid repellent agent is a fluorine-based liquid repellent agent.

6. The display device according to claim 2, wherein the first bank is disposed on the first insulating layer in the non-emission area.

7. The display device according to claim 6, wherein the via layer, the first insulating layer, the first and second bank patterns, and the first bank are connected to each other.

8. The display device according to claim 2, wherein the first insulating layer covers the first alignment electrode, the second alignment electrode, and the via layer in the emission area, and wherein the first insulating layer does not overlap the first bank in a plan view.

9. The display device according to claim 8, wherein the first bank is disposed on the via layer in the non-emission area.

10. The display device according to claim 2, wherein the first bank pattern is adjacent to a first end of the light-emitting element in the emission area and contacts a side surface of the first bank, and wherein the second bank pattern is adjacent to a second end of the light-emitting element in the emission area and contacts another side surface of the first bank.

11. The display device according to claim 2, wherein the plurality of pixels further comprises:

a first electrode disposed directly on the first bank pattern and electrically connected to a first end of the light-emitting element and the first alignment electrode; and a second electrode disposed directly on the second bank pattern and electrically connected to a second end of the light-emitting element and the second alignment electrode.

12. The display device according to claim 11, wherein the plurality of pixels further comprises:

a second insulating layer disposed on the light-emitting element and exposing the first end and the second end of the light-emitting element; and a third insulating layer disposed on the first electrode, and wherein the second insulating layer and the third insulating layer include an inorganic layer.

13. The display device according to claim 12, wherein the first electrode and the second electrode are disposed on different layers.

14. The display device according to claim 12, wherein the first electrode and the second electrode are disposed on a same layer.

15. The display device according to claim 12, wherein the first insulating layer includes:

a first contact hole exposing a portion of the first alignment electrode; and a second contact hole exposing a portion of the second alignment electrode, wherein the first electrode is electrically connected to the first alignment electrode through the first contact hole, and wherein the second electrode is electrically connected to the second alignment electrode through the second contact hole.

16. The display device according to claim 15, wherein the first and second contact holes are disposed in the non-emission area.

17. The display device according to claim 12, wherein the plurality of pixels further comprises:

a color conversion layer disposed on the first electrode and the second electrode in the emission area and configured to convert light of a first color emitted from the light-emitting element into light of a second color;

a second bank disposed on the first bank in the non-emission area and surrounding the color conversion layer; and a color filter disposed on the color conversion layer to selectively transmit the light of the second color.

18. The display device according to claim 17, wherein the second bank and the first bank includes a same material.

19. The display device according to claim 2, wherein the plurality of pixels includes at least one transistor disposed between the substrate and the via layer and electrically connected to the light-emitting element.

20. A method of manufacturing a display device, the method comprising forming at least one pixel including an emission area and a non- emission area on a substrate, wherein the forming of the at least one pixel comprises:

forming a via layer including an organic layer on the substrate;

forming a first alignment electrode and a second alignment electrode spaced apart from each other on the via layer of the emission area;

forming a first insulating layer including a lyophilic organic material and having a flat surface on the first and second alignment electrodes of the emission area;

forming a first bank pattern overlapping the first alignment electrode in a plan view and a second bank pattern overlapping the second alignment electrode in a plan view, on the first insulating layer of the emission area;

forming a first bank including an opening corresponding to the emission area and including a liquid repellent organic material, on the first insulating layer of the non-emission area;

aligning at least one light-emitting element on the first insulating layer between the first bank pattern and the second bank pattern in the emission area;

forming a first electrode electrically connected to each of a first end of the at least one light-emitting element and the first alignment electrode directly on the first bank pattern; and forming a second electrode electrically connected to each of a second end of the at least one light-emitting element and the second alignment electrode directly on the second bank pattern, and wherein the first bank pattern and the second bank pattern include the lyophilic organic material.

* * * * *